US009048412B2

(12) United States Patent
Oh et al.

(10) Patent No.: US 9,048,412 B2
(45) Date of Patent: Jun. 2, 2015

(54) MAGNETIC MEMORY DEVICES INCLUDING MAGNETIC LAYERS SEPARATED BY TUNNEL BARRIERS

(71) Applicants: Sechung Oh, Yongin-si (KR); Jangeun Lee, Suwon-si (KR); Jeahyoung Lee, Seoul (KR); Woojin Kim, Yongin-si (KR); Woo Chang Lim, Seoul (KR); Junho Jeong, Suwon-si (KR); Sukhun Choi, Suwon-si (KR)

(72) Inventors: Sechung Oh, Yongin-si (KR); Jangeun Lee, Suwon-si (KR); Jeahyoung Lee, Seoul (KR); Woojin Kim, Yongin-si (KR); Woo Chang Lim, Seoul (KR); Junho Jeong, Suwon-si (KR); Sukhun Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/206,053

(22) Filed: Mar. 12, 2014

(65) Prior Publication Data
US 2014/0191346 A1 Jul. 10, 2014

Related U.S. Application Data

(60) Division of application No. 13/838,598, filed on Mar. 15, 2013, now abandoned, which is a continuation of application No. 12/862,074, filed on Aug. 24, 2010, now Pat. No. 8,445,979.

(30) Foreign Application Priority Data

Sep. 11, 2009 (KR) .................... 10-2009-0086084
Sep. 30, 2009 (KR) .................... 10-2009-0093306

(51) Int. Cl.
*H01L 29/82* (2006.01)
*H01L 43/02* (2006.01)
(Continued)

(52) U.S. Cl.
CPC ............. *H01L 43/02* (2013.01); *B82Y 25/00* (2013.01); *G11C 11/16* (2013.01); *H01F 10/3254* (2013.01); *H01F 10/3268* (2013.01);
(Continued)

(58) Field of Classification Search
CPC ....... H01L 43/08; H01L 27/22; H01L 43/065; G11C 11/16
USPC .................. 257/421–427, E29.323; 438/3
See application file for complete search history.

(56) References Cited

U.S. PATENT DOCUMENTS 5,936,293 A * 8/1999 Parkin .......................... 257/422
2003/0059650 A1 3/2003 Nakagawa et al.
(Continued)

FOREIGN PATENT DOCUMENTS

CN 1823371 8/2006
JP 2005-510047 A 4/2005
(Continued)

*Primary Examiner* — Jami M Valentine
(74) *Attorney, Agent, or Firm* — Myers Bigel Sibley & Sajovec, P.A.

(57) ABSTRACT

A magnetic memory device may include a first vertical magnetic layer, a non-magnetic layer on the first vertical magnetic layer, and a first junction magnetic layer on the non-magnetic layer, with the non-magnetic layer being between the first vertical magnetic layer and the first junction magnetic layer. A tunnel barrier may be on the first junction magnetic layer, with the first junction magnetic layer being between the non-magnetic layer and the tunnel barrier. A second junction magnetic layer may be on the tunnel barrier with the tunnel barrier being between the first and second junction magnetic layers, and a second vertical magnetic layer may be on the second junction magnetic layer with the second junction magnetic layer being between the tunnel barrier and the second vertical magnetic layer.

21 Claims, 12 Drawing Sheets

(51) Int. Cl.
  *B82Y 25/00* (2011.01)
  *G11C 11/16* (2006.01)
  *H01F 10/32* (2006.01)
  *H01L 43/08* (2006.01)
  *H01L 43/10* (2006.01)
  *H01F 10/12* (2006.01)

(52) U.S. Cl.
  CPC ............... *H01L43/08* (2013.01); *H01L 43/10* (2013.01); *H01F 10/3236* (2013.01); *H01F 10/123* (2013.01); *H01F 10/3286* (2013.01)

(56) References Cited

U.S. PATENT DOCUMENTS

| | | |
|---|---|---|
| 2005/0002228 A1 | 1/2005 | Dieny et al. |
| 2005/0019608 A1 | 1/2005 | Kim et al. |
| 2005/0099724 A1 | 5/2005 | Nakamura et al. |
| 2005/0237677 A1 | 10/2005 | Shimazawa et al. |
| 2007/0072012 A1 | 3/2007 | Nakamura et al. |
| 2007/0086121 A1* | 4/2007 | Nagase et al. ............ 360/324.1 |
| 2007/0297222 A1 | 12/2007 | Leuschner |
| 2008/0151442 A1 | 6/2008 | Mauri et al. |
| 2009/0080238 A1 | 3/2009 | Yoshikawa et al. |
| 2009/0244792 A1 | 10/2009 | Nakayama et al. |

FOREIGN PATENT DOCUMENTS

| | | |
|---|---|---|
| JP | 2006-196612 A | 7/2006 |
| JP | 2007-142364 | 6/2007 |
| JP | 2008-041827 | 2/2008 |
| JP | 2009-081216 A | 4/2009 |
| KR | 1020020011946 A | 2/2002 |
| KR | 1020050018396 A | 2/2005 |
| KR | 1020060049223 A | 5/2006 |
| KR | 1020060087525 A | 8/2006 |
| KR | 1020060123641 A | 12/2006 |
| KR | 1020060125913 A | 12/2006 |
| KR | 1020070098423 A | 10/2007 |
| KR | 1020070106701 A | 11/2007 |

* cited by examiner

MAGNETIC MEMORY DEVICES INCLUDING MAGNETIC LAYERS SEPARATED BY TUNNEL BARRIERS

CROSS-REFERENCE TO RELATED APPLICATIONS

This U.S. non-provisional patent application claims the benefit of priority as a divisional of U.S. application Ser. No. 13/838,598, filed Mar. 15, 2013, which claims the benefit of priority as a continuation of U.S. application Ser. No. 12/862,074, filed Aug. 24, 2010, now U.S. Pat. No. 8,445,979, issued on May 21, 2013, which claims the benefit of priority under 35 U.S.C. §119 of Korean Patent Application No. 10-2009-0093306 filed Sep. 30, 2009, and Korean Application No. 10-2009-0086084 filed Sep. 11, 2009. The disclosures of all of the above referenced applications are hereby incorporated hereby in their entireties by reference.

BACKGROUND

The present disclosure herein relates to memory devices, and more particularly, to a magnetic memory devices.

As high speed operation and low power consumption of electronic devices are realized, memory devices may also require rapid read/write performance, and low operating voltages. Magnetic memory devices are being studied as memory devices to provide increased speed and reduced operating voltages. Because magnetic memory devices may provide high speed operation and/or non-volatile characteristics, they have drawn attention for the next generation of memories.

Commonly known magnetic memory devices may include a magnetic tunnel junction pattern (MTJ). The magnetic tunnel junction pattern is formed by two magnetic substances and an insulation layer interposed therebetween, and the resistance value of the magnetic tunnel junction pattern may be varied according to the magnetization directions of the two magnetic substances. Specifically, when the magnetization directions of the two magnetic substances are anti-parallel to each other, the magnetic tunnel junction pattern may have a high resistance value. When the magnetization directions of the two magnetic substances are parallel to each other, the magnetic tunnel junction pattern may have a low resistance value. The difference between these resistance values may be used to write/read data.

SUMMARY

According to some embodiments of the inventive concept, a magnetic memory device may provide enhanced reliability, a high magnetoresistance ratio and/or reduced operating power.

In some embodiments, a magnetic memory device may include a tunnel barrier on a substrate, first and second junction magnetic layers, and a non-magnetic layer. The first junction magnetic layer may contact one face of the tunnel barrier. A first vertical magnetic layer may be separated from the tunnel barrier by the first junction magnetic layer. The second junction magnetic layer may contact the other face of the tunnel barrier, and a second vertical magnetic layer may be separated from the tunnel barrier by the second junction magnetic layer. The non-magnetic layer may be between the first junction magnetic layer and the first vertical magnetic layer.

In other embodiments, the magnetization directions of the first vertical magnetic layer and the second vertical magnetic layer may be vertical to the plane of the substrate when the magnetic memory device operates.

In still other embodiments, another non-magnetic layer may be interposed between the second junction magnetic layer and the second vertical magnetic layer.

In even other embodiments, the first junction magnetic layer and/or the second junction magnetic layer may have a first crystal structure, while the first vertical magnetic layer and/or the second vertical magnetic layer may have a second crystal structure different from the first crystal structure.

In yet other embodiments, the crystal plane of the tunnel barrier at the interface between the tunnel barrier and the first junction may be identical to the crystal plane of the first junction magnetic layer at the interface. The first crystal structure may be a NaCl-type crystal structure or a BCC crystal structure, and the crystal planes may be a (001) crystal plane.

In further embodiments, the second crystal structure may be an L10 crystal structure, a FCC crystal structure, or a hexagonal close-packing (HCP) lattice.

In still further embodiments, the first vertical magnetic layer and/or the second vertical magnetic layer may include a RE-TM (Rare Earth-Transition Metal) alloy.

In even further embodiments, the first vertical magnetic layer and/or the second magnetic layer may include non-magnetic metal layers and ferromagnetic metal layers alternately stacked multiple times, and the ferromagnetic metal layers may have a thickness of one to several atoms.

In yet further embodiments, the first junction magnetic layer and/or the second junction magnetic layer may include an alloy magnetic material including at least one selected from the group consisting of cobalt (Co), iron (Fe), and nickel (Ni), and the alloy magnetic substance may further include a non-magnetic element.

In some embodiments, the non-magnetic layer may have a thickness in a range of about 2 Å (Angstroms) to about 20 Å (Angstroms).

In other embodiments, the non-magnetic layer may include at least one selected from non-magnetic metals. The non-magnetic metal may be at least one selected from non-magnetic transition metals.

In still other embodiments, the first vertical magnetic layer and the first junction magnetic layer may be exchange-coupled with each other by the non-magnetic layer.

In yet other embodiments, the non-magnetic layer may further include a metal compound layer contacting the top face and/or bottom face of the non-magnetic layer, and the metal compound layer may include at least one selected from the group consisting of metal oxide, metal nitride, and metal oxynitrides.

In even other embodiments of the inventive concept, magnetic memory devices may include a tunnel barrier on a substrate, a free magnetic layer contacting one face of the tunnel barrier and having a plane parallel to the plane of the substrate, and a reference magnetic layer contacting the other face of the tunnel barrier and having a plane parallel to the plane of the substrate. The free magnetic layer and the reference magnetic layer may include iron (Fe), and the iron content of the free magnetic layer may be equal to or more than that of the reference magnetic layer.

In some embodiments, the iron (Fe) content of the free magnetic layer may be in a range of about 40% to about 60% by atomic percent.

In other embodiments, the free magnetic layer and/or the reference magnetic layer may further include at least one selected from Co and Ni.

In still other embodiments, the free magnetic layer and/or the reference magnetic layer may further include a non-magnetic element.

In even other embodiments, the free magnetic layer and the reference magnetic layer may have magnetization directions vertical (perpendicular) to the plane/surface of the substrate when the magnetic memory device operates.

In yet other embodiments, the free magnetic layer and reference magnetic layer may have magnetization directions parallel to the plane/surface of the substrate when the magnetic memory device operates.

In still other embodiments of the inventive concept, magnetic memory devices may include a substrate. A first magnetic substance, a tunnel barrier, and a second magnetic substance may be sequentially stacked on the substrate. The first magnetic substance may include a first vertical magnetic layer which is adjacent to the substrate and has a hexagonal close-packing (HCP) lattice structure.

In some embodiments, the c-axis of the hexagonal close-packing lattice may be substantially vertical to the plane of the substrate.

In other embodiments, the c-axis may be an axis at which the first vertical magnetic layer may be easily magnetized.

In still other embodiments, the magnetic memory device may further include a seed layer including the HCP lattice between the substrate and the first vertical magnetic layer.

In even other embodiments, the second magnetic substrate may further include a second vertical magnetic layer having a hexagonal close-packing lattice structure.

In yet other embodiments, the first magnetic substance may include a first magnetic junction layer which is adjacent to the tunnel barrier on the first vertical magnetic layer and the second magnetic substance may include an second magnetic junction layer which is adjacent to the tunnel barrier under the second vertical magnetic layer.

In further embodiments, the second magnetic junction layer and the first magnetic junction layer may include a soft magnetic material.

In still further embodiments, the magnetic memory device may further include an exchange coupling control layer between the first vertical magnetic layer and the first magnetic junction layer and/or between the second vertical magnetic layer and the second magnetic junction layer.

In even further embodiments, the exchange coupling control layer may include at least one selected from metal elements including a transition metal element.

In yet further embodiments, the exchange coupling control layer may further include an oxide layer formed by oxidation of the surface of the exchange coupling control layer.

In alternative embodiments, the second magnetic substance may further include non-magnetic layers and ferromagnetic layers alternately stacked multiple times on the second vertical magnetic layer. The ferromagnetic layers may have an atomic layer thickness.

In still alternative embodiments, the first vertical magnetic layer may include a disordered cobalt-platinum alloy having a platinum content in a range of about 10% to about 45% by atomic percent.

In even alternative embodiments, the first vertical magnetic layer may include $Co_3Pt$.

In yet alternative embodiments, the first vertical magnetic layer may further include at least one selected from the group consisting of boron (B), chromium (Cr), and copper (Cu).

In other alternative embodiments, the tunnel barrier may include at least one selected from the group consisting of magnesium (Mg), titanium (Ti), aluminum (Al), an oxide of magnesium-zinc (MgZn) and/or magnesium-boron (MgB), and/or a nitride of titanium (Ti) and/or vanadium (V).

In still other alternative embodiments, the magnetic memory device may further include a capping layer on the second magnetic substance. The capping layer may include at least one selected from the group consisting of tantalum (Ta), aluminum (Al), copper (Cu), gold (Au), silver (Ag), titanium (Ti), tantalum nitride (TaN), and/or titanium nitride (TiN).

In even other alternative embodiments, the current may flow in a direction substantially vertical to the plane of the substrate when the magnetic memory device operates.

In yet other alternative embodiments, the magnetization directions of the second magnetic layer and the first magnetic layer may be substantially vertical to the plane of the substrate.

According to some embodiments, a magnetic memory device may include a first vertical magnetic layer, a non-magnetic layer on the first vertical magnetic layer, and a first junction magnetic layer on the non-magnetic layer with the non-magnetic layer being between the first vertical magnetic layer and the first junction magnetic layer. A tunnel barrier may be on the first junction magnetic layer with the first junction magnetic layer being between the non-magnetic layer and the tunnel barrier. A second junction magnetic layer may be on the tunnel barrier with the tunnel barrier being between the first and second junction magnetic layers. A second vertical magnetic layer may be on the second junction magnetic layer with the second junction magnetic layer being between the tunnel barrier and the second vertical magnetic layer.

According to some other embodiments, a magnetic memory device may include a free magnetic layer comprising iron (Fe), a tunnel barrier on the free magnetic layer, and a reference magnetic layer comprising iron (Fe) on the tunnel barrier. The tunnel barrier may be between the free magnetic layer and the reference magnetic layer. A concentration of iron in the free magnetic layer may be at least as great as a concentration of iron in the reference magnetic layer.

According to still other embodiments, a magnetic memory device may include a substrate, a first magnetic substance on the substrate, a tunnel barrier on the first magnetic substance, and a second magnetic substance on the tunnel barrier. The first magnetic substance may include a vertical magnetic layer having a hexagonal close-packing (HCP) lattice structure adjacent the substrate. The magnetic substance may be between the substrate and the tunnel barrier, and the tunnel barrier may be between the first and second magnetic substances.

BRIEF DESCRIPTION OF THE DRAWINGS

The accompanying drawings are included to provide a further understanding of inventive concepts, and are incorporated in and constitute a part of this specification. The drawings illustrate exemplary embodiments of inventive concepts and, together with the description, serve to explain principles of inventive concepts. In the drawings.

DETAILED DESCRIPTION OF THE EMBODIMENTS

Figure 1:
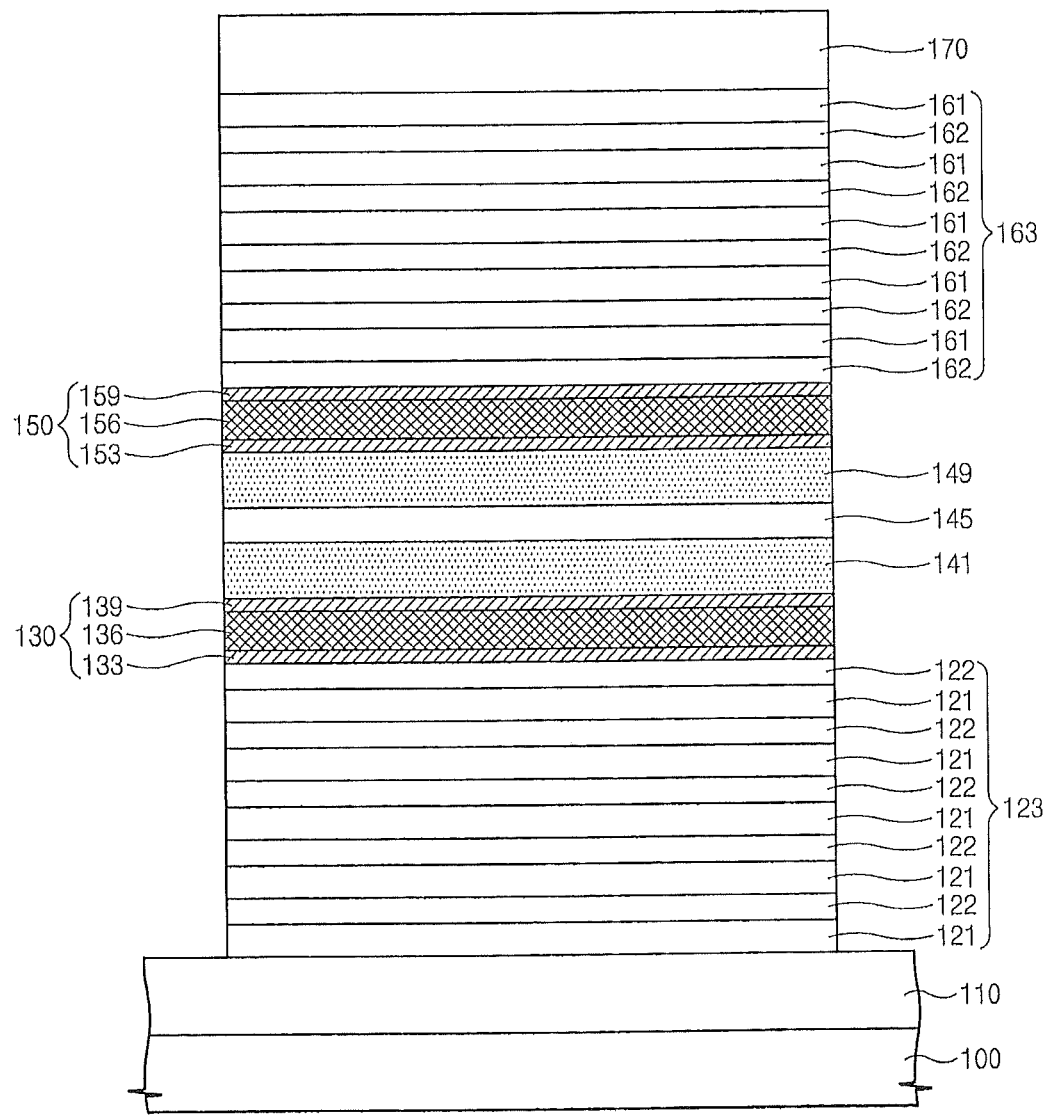
FIG. 1 is a view illustrating a magnetic memory device according to first embodiments of the inventive concepts.

Magnetic memory devices and methods for forming the same according to embodiments of inventive concepts will be described below in more detail with reference to the accompanying drawings. Embodiments to be described are provided such that the spirit of inventive concepts is easily understood by those skilled in the art, and inventive concepts should not be construed as limited thereby. Embodiments of inventive concepts may be embodied in different forms within the technical spirit and scope of inventive concepts. In the drawings, the thicknesses and relative thicknesses of elements may be exaggerated to clearly illustrate embodiments of inventive concepts. Terms related to positions, such as upper and lower in the specification, are relative expressions to clarify the description and should not be construed as limited to positions between absolute elements.

Advantages and features of inventive concepts and methods of accomplishing the same may be understood more readily by reference to the following detailed description of embodiments and the accompanying drawings. Inventive concepts may, however, be embodied in many different forms and should not be construed as being limited to embodiments set forth herein. Rather, these embodiments are provided so that this disclosure will be thorough and complete and will fully convey inventive concepts to those skilled in the art, and inventive concepts will only be defined by the appended claims. Like reference numerals refer to like elements throughout the specification.

It will be understood that when an element is referred to as being "on", "connected to", or "coupled to" another element, it can be directly on, directly connected to, or directly coupled to the other element or intervening elements may be present. In contrast, when an element is referred to as being "directly on", "directly connected to", or "directly coupled to" another element, there are no intervening elements present. As used herein, the term "and/or" includes any and all combinations of one or more of the associated listed items.

It will be understood that, although the terms first, second, etc. may be used herein to describe various elements, components, layers, and/or sections, these elements, components, layers, and/or sections should not be limited by these terms. These terms are only used to distinguish one element, component or section from another element, component, or section. Thus, a first element, component, layer, or section discussed below could be termed a second element, component, layer, or section without departing from the teachings of inventive concepts.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In addition, when terms used in this specification are not specifically defined, all the terms used in this specification (including technical and scientific terms) can be understood by those skilled in the art. Further, when general terms defined in the dictionaries are not specifically defined, the terms will have the normal meaning in the art.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, layers, and/or components, but do not preclude the presence or addition of one or more other features, integers, steps, operations, elements, layers, components, and/or groups thereof.

In the drawings, the illustrated features may be changed due to, for example, the manufacturing technology and/or tolerance. Accordingly, it should be understood that example embodiments of inventive concepts are not limited to the drawings but include modifications of the features of elements caused due to, for example, manufacturing tolerances.

A First Embodiment and Modified Examples Thereof

Referring to FIG. 1, a magnetic memory device according to first embodiments of inventive concepts will be described. A lower electrode 110 is disposed on a substrate 100. The substrate 100 may be a semiconductor-based semiconductor substrate. The substrate 100 may include a conductive region and/or an insulating region. The lower electrode 110 may be electrically connected to the conductive region of the substrate 100. The lower electrode 110 may be disposed on the substrate 100 and/or in the substrate 100. The lower electrode 110, for example, may have any one shape selected from the group consisting of line, island, and/or plate.

A first vertical magnetic layer 123 may be disposed on the lower electrode 110. In an embodiment, the first vertical magnetic layer 123 may include non-magnetic layers 121 and ferromagnetic layers 122, which are alternately stacked. The ferromagnetic layers 122 may include at least one selected from the group consisting of iron (Fe), cobalt (Co), and/or nickel (Ni), and the non-magnetic layers 121 may include at least one selected from the group consisting of chromium (Cr), platinum (Pt), palladium (Pd), iridium (Ir), ruthenium (Ru), rhodium (Rh), osmium (Os), rhenium (Re), gold (Au), and/or copper (Cu). For example, the first vertical magnetic layer 123 may be [Co/Pt]m, [Co/Pd]m, [Ni/Pt]m (m is a stacking number of each layer and a natural number of 2 or more), or a combination thereof. In an embodiment, the non-magnetic layers 121 and ferromagnetic layers 122 may be stacked in a range of about 2 to about 20 times, respectively. When the current flows in a direction vertical (perpendicular) to the substrate 100 and the planes of the first vertical magnetic layers 123, the first vertical magnetic layer 123 may be configured such that it has a magnetization direction parallel to the current. For this configuration, the ferromagnetic layers 122 may be thinly formed to have a thickness of one to several atomic layers.

A first non-magnetic layer 130 may be disposed on the first vertical magnetic layer 123. The first non-magnetic layer 130 may have a relatively thin thickness. For example, the first non-magnetic layer 130 may be formed to have a thickness in a range of about 2 Å (Angstroms) to about 20 Å (Angstroms). The first non-magnetic layer 130 may not have a texture. For example, the first non-magnetic layer 130 may be uniformly formed on the first vertical magnetic layer 123 and may not have a texture by the thin thickness.

The first non-magnetic layer 130 may include at least one selected from non-magnetic metal elements including a non-magnetic transition metal. For example, the first non-magnetic layer 130 may include at least one selected from the group consisting of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobdenum (Nb), zirconium (Zr), yttrium (Y), and/or hafnium (Hf).

In an embodiment, the first non-magnetic layer may be formed with a plurality of layers. For example, the first non-magnetic layer 130 may include a first lower metal compound layer 133, a first non-magnetic metal layer 136, and a first upper metal compound layer 139, which are sequentially stacked on the vertical magnetic layer 123. While not shown in FIG. 1, the first non-magnetic layer 130 may include a metal compound layer/non-magnetic metal layer and/or a non-magnetic metal layer/metal compound layer, which are sequentially stacked on the vertical magnetic layer 123. The first non-magnetic metal layer 136 may include at least one selected from the group consisting of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobdenum (Nb), zirconium (Zr), yttrium (Y), and/or hafnium (Hf). The first lower and upper metal compound layers 133, 139 may be a metal oxide, a metal nitride, a metal oxynitride, and/or a combination thereof. For example, each metal compound layer may be formed of a compound of the metal layer. Conversely, the first non-magnetic layer 130 may include only a single metal layer or a plurality of metal layers. The diffusion of metal atoms in the first non-magnetic metal layer 136 into another adjacent layer may be prevented and/or reduced by the first lower and upper metal compound layers 133, 139.

A first junction magnetic layer 141 may be disposed on the first non-magnetic layer 130. The first junction magnetic layer 141 may include a soft magnetic material. The first junction magnetic layer 141 may have a low damping constant and a high spin polarization ratio. For example, the first junction metal layer 141 may include at least one selected from the group consisting of cobalt (Co), iron (Fe), and/or nickel (Ni). The first junction magnetic layer 141 may further include at least one selected from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and/or nitrogen (N). Specifically, the first junction magnetic layer 141 may include CoFe and/or NiFe, and may further include boron (B). Furthermore, in order to decrease a saturation magnetization of the first junction magnetic layer 141, the first junction magnetic layer 141 may further include at least one selected from the group consisting of titanium (Ti), aluminum (Al), silicon (Si), magnesium (Mg), tantalum (Ta), and/or silicon (Si).

The first non-magnetic layer 130 between the first junction magnetic layer 141 and the first vertical magnetic layer 123 may enhance the vertical magnetic anisotropy of a magnetic memory cell including them. For example, the first junction magnetic layer 141 may be antiferromagnetically or ferromagnetically exchange coupled with the first vertical magnetic layer 123 by the first non-magnetic layer 130. Because the first vertical magnetic layer 123 has a high vertical magnetic anisotropy, the vertical magnetic anisotropy of the first junction magnetic layer 141 exchange-coupled with the first vertical magnetic layer 123 may be also enhanced. The vertical magnetic anisotropy in the specification is defined as a property of the layer to be magnetized in the direction vertical to the plane of the substrate 100. As used herein, the term vertical may refer to a direction that is perpendicular with respect to a surface of substrate 100.

The crystal structure of the first junction magnetic layer 141 may have a structure different from that of the first vertical magnetic layer 123 due to the first non-magnetic layer 130. Accordingly, the magnetoresistance ratio of a magnetic tunnel junction may be further enhanced. A detailed description on this is provided with respect to methods for forming a first junction metal layer 141 to be subsequently described.

A tunnel barrier 145 may be disposed on the first junction metal layer 141. The tunnel barrier 145 may have a thickness thinner than the spin diffusion distance. The tunnel barrier 145 may include a non-magnetic material. In an embodiment, the tunnel barrier 145 may be formed of an insulating material layer. Conversely, the tunnel barrier 145 may include a plurality of layers. For example, the tunnel barrier 145 may include at least one selected from the group consisting of magnesium (Mg), titanium (Ti), aluminum (Al), an oxide of magnesium-zinc (MgZn) and/or magnesium-boron (MgB), and/or a nitride of titanium (Ti) and/or vanadium (V). For example, the tunnel barrier may be formed of a magnesium oxide (MgO) layer.

The tunnel barrier 145 may have a crystal structure similar to that of the first junction magnetic layer 141. For example, the first junction magnetic layer 141 may include a magnetic material having a body-centered cubic (BCC) structure or a magnetic material with a body-centered cubic structure, including a non-magnetic element. When the first junction magnetic layer 141 includes a non-magnetic element, the magnetic material may become amorphous. The tunnel barrier 145 and the first junction magnetic layer 141 may have a NaCl-type crystal structure and a body-centered cubic structure, respectively, and the (001) crystal plane of the tunnel barrier 145 may be contacted with the (001) crystal plane of the first junction magnetic layer 141 to form an interface. The magnetoresistance ratio of a magnetic tunnel junction including the tunnel barrier 145 and the first junction magnetic layer 141 may be thereby enhanced.

A second junction magnetic layer 149 may be disposed on the tunnel barrier 145. The second junction magnetic layer 149 may include a soft magnetic material. For example, the second junction magnetic layer 149 may include cobalt (Co), iron (Fe), and/or nickel (Ni) atoms such that the contents of the atoms may be determined to reduce the saturation magnetization of the second junction magnetic layer 149. The second junction magnetic layer 149 may have a low damping constant and a high spin polarization ratio. In order to achieve these, the second junction magnetic layer 149 may further include at least one selected from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and/or nitrogen (N). For example, the second junction magnetic layer 149 may include CoFe and/or NiFe, and may further include boron. Furthermore, the second junction magnetic layer 149 may further include at least one selected from non-magnetic elements including titanium (Ti), aluminum (Al), silicon (Si), magnesium (Mg), and/or tantalum (Ta). The content of the selected non-magnetic element in the second junction magnetic layer 149 may be in a range of about 1% to about 15% by atomic percent. When the second junction magnetic layer 149 is used as a free layer of a magnetic memory cell, the saturation magnetization of the second junction magnetic layer 149 may be controlled to a value less than that of the first junction magnetic layer 141.

The second junction magnetic layer 149 may have a crystal structure similar to that of the tunnel barrier 145. For example, the tunnel barrier 145 and the second junction magnetic layer 149 may have a NaCl-type crystal structure and a body-centered cubic structure, and the (001) crystal plane of the tunnel barrier 145 may be contacted with the (001) crystal plane of the second junction magnetic layer 149 to form an interface. The magnetoresistance ratio of a magnetic tunnel junction including the second junction magnetic layer 149 and the tunnel barrier 145 may be thereby enhanced.

In some embodiments, the content of ferromagnetic atoms in the second junction magnetic layer 149 may be different from that of ferromagnetic atoms in the first junction magnetic layer 141. For example, the first and second junction magnetic layers 141, 149 may include at least one selected from cobalt (Co), nickel (Ni), and/or iron (Fe), while the iron (Fe) content in the second junction magnetic layer 149 may be equal to or more than that in the first junction magnetic layer 141. In this case, the second junction magnetic layer 149 may serve as a free layer.

A second non-magnetic layer 150 may be disposed on the second junction magnetic layer 149. The second non-magnetic layer 150 may be formed with a relatively thin thickness. For example, the second non-magnetic layer 150 may be formed to have a thickness in a range of about 2 Å (Angstroms) to about 20 Å (Angstroms). The second non-magnetic layer 150 may not have a texture. For example, the second non-magnetic layer 150 may be uniformly formed on the second junction magnetic layer 149 and may not have a texture by the thin thickness.

The second non-magnetic layer 150 may include at least one selected from non-magnetic metal elements including a non-magnetic transition metal. For example, the second non-magnetic layer 150 may include at least one selected from the group consisting of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobdenum (Nb), zirconium (Zr), yttrium (Y), and/or hafnium (Hf).

In some embodiments, the second non-magnetic layer 150 is formed with a plurality of layers. For example, the second non-magnetic layer 150 may include a second lower metal compound layer 153, a second non-magnetic metal layer 156, and a second upper metal compound layer 159, which are sequentially stacked on the second junction magnetic layer 149. While not shown in FIG. 1, the second non-magnetic layer 150 may include a metal compound layer/non-magnetic metal layer or a non-magnetic metal layer/metal compound layer, which are sequentially stacked on the second junction magnetic layer 149. The second non-magnetic metal layer 156 may include at least one selected from the group consisting of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobdenum (Nb), zirconium (Zr), yttrium (Y), and/or hafnium (Hf). The second lower and upper metal compound layers 153, 159 may be a metal oxide, a metal nitride, a metal oxynitride, or a combination thereof. For example, the second lower and upper metal compound layers 153, 159 may be formed of a compound of the second non-magnetic metal layer 156. The diffusion of metal atoms in the second non-magnetic metal layer 156 into another adjacent layer may be prevented and/or reduced by the second lower and upper metal compound layers 153, 159. Conversely, the second non-magnetic layer 150 may include only a single metal layer or a plurality of metal layers.

A second vertical magnetic layer 163 may be disposed on the second non-magnetic layer 150. In some embodiments, the second vertical magnetic layer 163 may include non-magnetic layers 161 and ferromagnetic layers 162, alternately stacked. The ferromagnetic layers 162 may include at least one selected from the group consisting of iron (Fe), cobalt (Co), and/or nickel (Ni), while the non-magnetic layers 161 may include at least one selected from the group consisting of chromium (Cr), platinum (Pt), palladium (Pd), iridium (Ir), ruthenium (Ru), rhodium (Rh), osmium (Os), rhenium (Re), gold (Au), and/or copper (Cu). For example, the second vertical magnetic layer 163 may include [Co/Pt]n, [Co/Pd]n, [Ni/Pt]n (n is a stacking number of each layer and a natural number of 2 or more), or a combination thereof. The ferromagnetic layers 162 may be formed to have a thickness of one to several atoms. The exchange coupling between the second vertical magnetic layer 163 and the second junction magnetic layer 149 may be reinforced by the second non-magnetic layer 150. The vertical magnetic anisotropy of the second junction magnetic layer 149 may be thereby enhanced.

The stacking numbers n of non-magnetic layers 161 and ferromagnetic layers 162 in the second vertical magnetic layer 163 may be different from those m of non-magnetic layers 121 and ferromagnetic layers 122 in the first vertical magnetic layer 123. For example, the stacking numbers of non-magnetic layers 161 and ferromagnetic layers 162 in the second vertical magnetic layer 163 may be smaller than those of non-magnetic layers 121 and ferromagnetic layers 122 in the first vertical magnetic layer 123. In this case, a first junction magnetic layer 141 adjacent to the first vertical magnetic layer 123 may serve as a reference layer of a magnetic memory cell, while a second junction magnetic layer 149 adjacent to the second vertical magnetic layer 163 may serve as a free layer of the magnetic memory cell. Conversely, the stacking numbers n of non-magnetic layers 161 and ferromagnetic layers 162 in the second vertical magnetic layer 163 may be larger than those m of non-magnetic layers 121 and ferromagnetic layers 122 in the first vertical magnetic layer 123. In this case, the second junction magnetic layer 141 may serve as a reference layer, while the first junction magnetic layer 149 may serve as a free layer.

The first and second junction magnetic layers 141, 149 may have different magnetic properties according to functions to be performed. For example, the junction magnetic layer serving as a free layer may have a saturation magnetization smaller than that of the junction magnetic layer serving as a reference layer. The saturation magnetization may be controlled by the ratio of a ferromagnetic material (Co, Ni, and/or Fe) to be included and/or ratio of a non-magnetic material.

The first junction magnetic layer 141, the tunnel barrier 145, and the second junction magnetic layer 149 may constitute a magnetic tunnel junction of a magnetic memory cell. Data may be stored into a magnetic memory cell including the magnetic tunnel junction by using a difference between resistance values of the magnetic tunnel junction whether the magnetization directions of the free layer and the reference layer are parallel or anti-parallel each other. The magnetization direction of the free layer may be varied according to the direction of the current supplied to the magnetic memory cell. For example, the magnetization direction of the free layer in the case of the current being supplied from the first junction magnetic layer 141 to the second junction magnetic layer 149 may be anti-parallel to that in the case of the current being supplied from the second junction magnetic layer 149 to the first junction magnetic layer 141. The magnetization direction of the reference layer and the free layer may be vertical to the plane of the substrate 100. The reference layer may be vertical to the plane of the substrate 100 and have a fixed first magnetization direction. The free layer has a magnetization direction vertical to the plane of the substrate 100, and the magnetization direction of the free layer may be the first magnetization direction or a second magnetization direction anti-parallel to the first magnetization according to the direction of the current supplied.

A capping layer 170 may be disposed on the second vertical magnetic layer 163. The capping layer 170 may include at least one selected from the group consisting of tantalum (Ta), aluminum (Al), copper (Cu), gold (Au), silver (Ag), titanium (Ti), ruthenium (Ru), magnesium (Mg), tantalum nitride (TaN), and/or titanium nitride (TiN).

Figure 2:
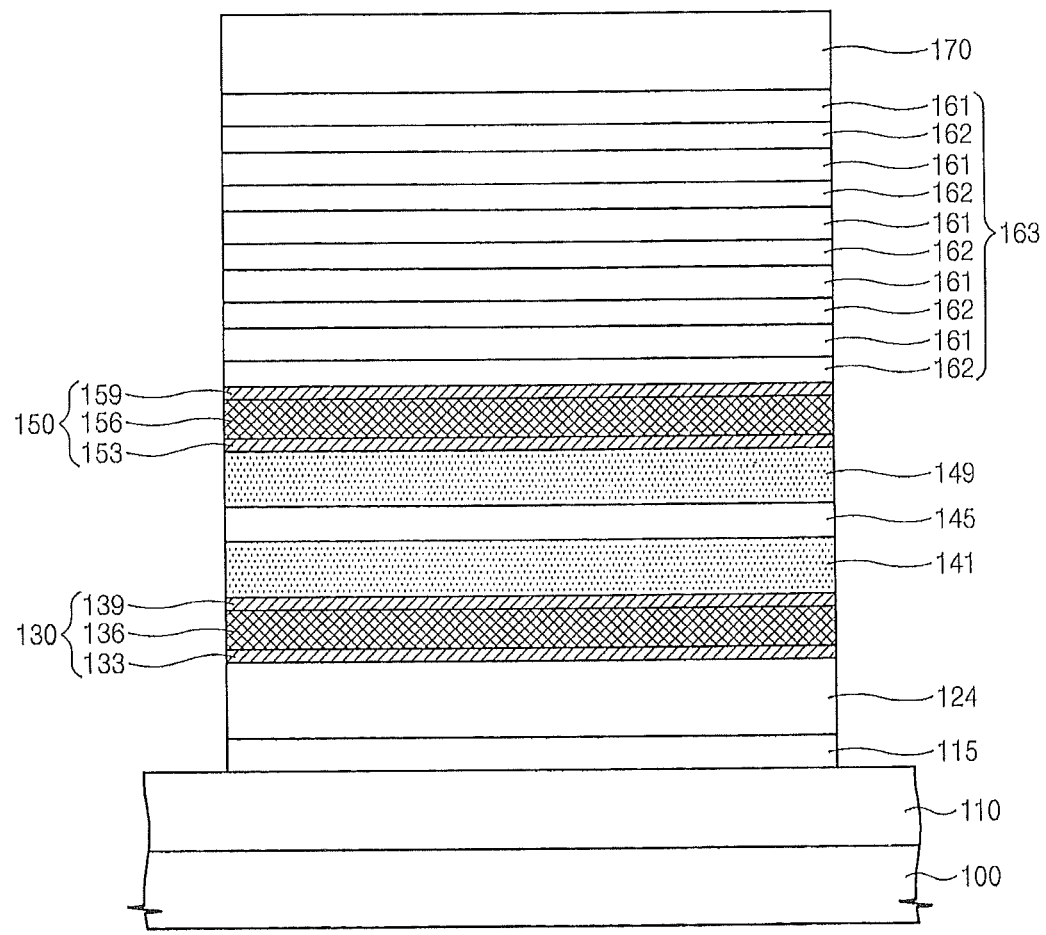
FIG. 2 is a view illustrating a modified example of a magnetic memory device according to first embodiments of the inventive concepts.

Referring to FIG. 2, one modified example of a magnetic memory device according to some embodiments of inventive concepts will be described. Description of like elements substantially identical to the elements described in FIG. 1 may be omitted for the sake of clarity and/or conciseness.

A lower electrode 110 is disposed on a substrate 100. A seed layer 115 and a first vertical magnetic layer 124 are disposed on the lower electrode 110. The seed layer 115 may include metal atoms constituting a hexagonal closed packing lattice (HCP). The seed layer 115 may be formed to have a thickness ranging from about 10 Å (Angstroms) to about 100 Å (Angstroms). The seed layer 115 may include ruthenium (Ru) or titanium (Ti). Conversely, the seed layer 115 may include metal atoms constituting a face centered cubic lattice (FCC). For example, the seed layer 115 may include platinum (Pt), palladium (Pd), gold (Au), silver (Ag), copper (Cu), and/or aluminum (Al). The seed layer 115 may include a single layer or a plurality of layers having different crystal structures. Conversely, when a material constituting the first vertical magnetic layer 124 is amorphous, the seed layer 115 may be omitted.

The magnetization direction of the first vertical magnetic layer 124 may be substantially vertical to the plane of the substrate 100 and modified. In order to achieve this, the first vertical magnetic layer 124 may include at least one selected from the group consisting of a material with an L10 crystal structure, a material with a hexagonal closed packing (HCP) lattice, and an amorphous rare-earth transition metal (RE-TM) alloy. For example, the first vertical magnetic layer 124 may be at least one selected from materials with an L10 crystal structure including $Fe_{50}Pt_{50}$, $Fe_{50}Pd_{50}$, $Co_{50}Pt_{50}$, $Co_{50}Pd_{50}$, and/or $Fe_{50}Ni_{50}$. Conversely, the first vertical magnetic layer 124 may include a disordered cobalt-platinum alloy having a platinum content of about 10% to about 45% by atomic percent or an ordered $Co_3Pt$ alloy, with a hexagonal close packing (HCP) lattice. Conversely, the first vertical magnetic layer 124 may include at least one from amorphous RE-TM alloys including at least one selected from the group consisting of iron (Fe), cobalt (Co), and/or nickel (Ni) and at least one selected from the group consisting of rare earth terbium (Tb), dysprosium (Dy), and/or gadolinium (Gd).

A first non-magnetic layer 130 may be disposed on the first vertical magnetic layer 124. The first non-magnetic layer 130 may be formed with a thin thickness. For example, the first non-magnetic layer 130 may be formed to have a thickness in a range of about 2 Å (Angstroms) to about 20 Å (Angstroms). The first non-magnetic layer 130 may not have a texture. For example, the first non-magnetic layer 130 may be uniformly formed on the first vertical magnetic layer 124 and may not have a texture by the thin thickness.

The first non-magnetic layer 130 may include at least one selected from non-magnetic metal elements including a non-magnetic transition metal. In an embodiment, the first non-magnetic layer 130 may be formed with a plurality of layers. For example, the first non-magnetic layer 130 may include a first lower metal compound layer 133, a first non-magnetic metal layer 136, and a first upper metal compound layer 139, which are sequentially stacked on the vertical magnetic layer 124. While not shown in FIG. 2, the first non-magnetic layer 130 may include a metal compound layer/non magnetic metal layer or a non-magnetic metal layer/metal compound layer, which are sequentially stacked on the first vertical magnetic layer 124. The non-magnetic metal layer may include at least one selected from the group consisting of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobdenum (Nb), zirconium (Zr), yttrium (Y), and/or hafnium (Hf). The first lower and upper metal compound layers 133, 139 may be a metal oxide, a metal nitride, a metal oxynitride, or a combination thereof. For example, the metal compound layer may be a compound of the metal layer. Conversely, the first non-magnetic layer 130 may include only a single metal layer or a plurality of metal layers.

A first junction magnetic layer 141, a tunnel barrier 145, and a second junction magnetic layer 149 may be sequentially stacked on the first non-magnetic layer 130. The first junction magnetic layer 141, the tunnel barrier 145, and the second junction magnetic layer 149 may constitute a magnetic tunnel junction. The first junction magnetic layer 141 may be strongly exchange-coupled with the first vertical magnetic layer 123 by the first non-magnetic layer 130. A vertical magnetic anisotropy of the first junction magnetic layer 141 may be thereby enhanced. The first junction magnetic layer 141 and the second junction magnetic layer 149 may include a soft magnetic material. When a magnetic memory cell operates, one of the first junction magnetic layer 141 and the second junction magnetic layer 149 may serve as a reference layer and the other may serve as a free layer. The junction magnetic layer serving as a free layer may have a saturation magnetization lower than that of the junction magnetic layer serving as a reference layer.

A second non-magnetic layer 150 may be disposed on the second junction magnetic layer 149. The second non-magnetic layer 150 may be formed with a thin thickness. For example, the second non-magnetic layer may be formed have a thickness in a range of about 2 Å (Angstroms) to about 20 Å (Angstroms). The second non-magnetic layer 150 may not have a texture. For example, the second non-magnetic layer 150 may be uniformly formed on the second junction magnetic layer 149 and may not have a texture by the thin thickness.

A second vertical magnetic layer 163 may be disposed on the second non-magnetic layer 150. The second vertical magnetic layer 163 may be configured such that it has a magnetization direction vertical to the plane of the substrate 100. For example, the second vertical magnetic layer 163 may include non-magnetic layers 161 and ferromagnetic layers 162, alternately stacked, and the ferromagnetic layers 162 may be formed with a thickness of one to several atoms. The magnetization direction of the ferromagnetic layers 162 may be vertical to the plane of the substrate 100. The second vertical magnetic layer 163 may be exchange-coupled with the second junction magnetic layer 149 by the second non-magnetic layer 150.

A capping layer 170 may be formed on the second vertical magnetic layer 163. The capping layer 170 may include at least one selected from the group consisting of tantalum (Ta), aluminum (Al), copper (Cu), gold (Au), silver (Ag), titanium (Ti), ruthenium (Ru), magnesium (Mg), tantalum nitride (TaN), and/or titanium nitride (TiN).

Figure 3:
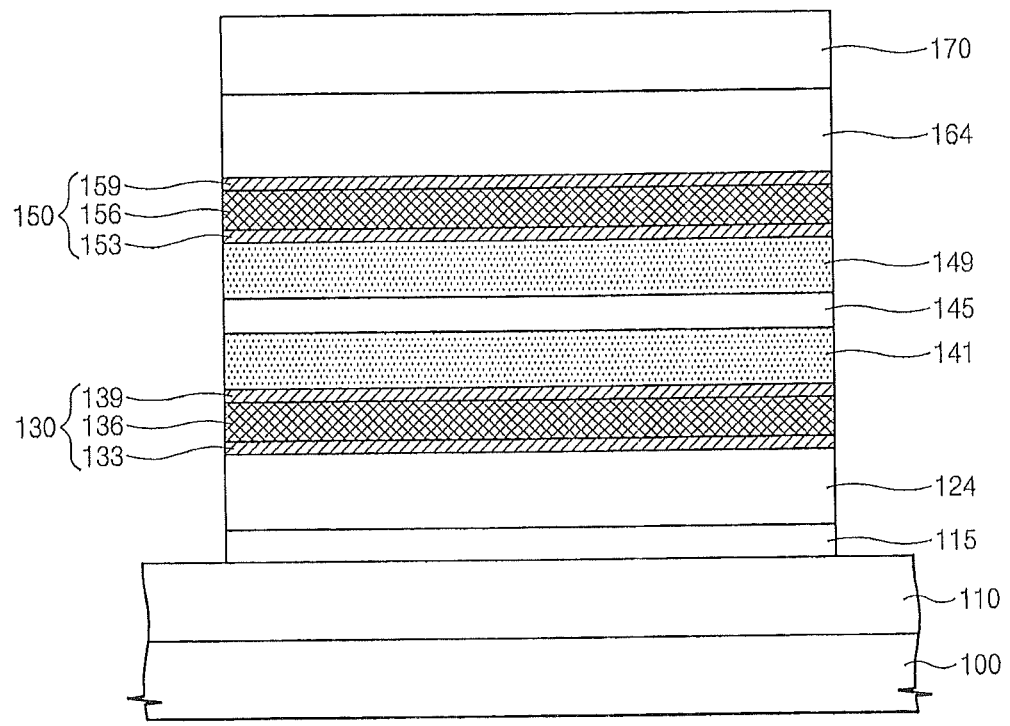
FIG. 3 is a view illustrating another modified example of a magnetic memory device according to first embodiments of inventive concepts.

Referring to FIG. 3, one modified example of a magnetic memory device according to embodiments of inventive concepts will be described. A seed layer 115 and a first vertical magnetic layer 124 are sequentially stacked on a substrate 100 and a lower electrode 110. The seed layer 115 may include a single metal layer and a plurality of metal layers. The first vertical magnetic layer 124 may include a material having an axis which is vertical to the plane of the substrate 100 and easily magnetized. The first vertical magnetic layer 124 may include at least one selected from the group consisting of a material with an L10 crystal structure, a material with a hexagonal close packing (HCP) lattice, and an amorphous RE-TM alloy. When the first vertical magnetic layer 124 includes an amorphous RE-TM alloy, the seed layer 115 may be omitted.

A first non-magnetic layer 130 may be disposed on the first vertical magnetic layer 124. The first non-magnetic layer 130 may be formed with a thin thickness. For example, the first non-magnetic layer 130 may be formed to have a thickness in a range of about 2 Å (Angstroms) to about 20 Å (Angstroms). The first non-magnetic layer 130 may not have a texture.

The first non-magnetic layer 130 may include at least one selected from non-magnetic metal elements including a non-magnetic transition metal. In an embodiment, the first non-magnetic layer 130 may be formed with a plurality of layers. For example, the first non-magnetic layer 130 may include a first lower metal compound layer 133, a first non-magnetic metal layer 136, and a first upper metal compound layer 139, which are sequentially stacked on the vertical magnetic layer 124. Unlike the illustration, the first non-magnetic layer 130 may include a metal compound layer/non-magnetic metal layer or a non-magnetic metal layer/metal compound layer, which are sequentially stacked on the first vertical magnetic layer 124. Conversely, the first non-magnetic layer 130 may include only a single metal layer or a plurality of metal layers. The first vertical magnetic layer 123 may be exchange coupled with the first junction magnetic layer 141 by the first non-magnetic layer 130.

A first junction magnetic layer 141, a tunnel barrier 145, and a second junction magnetic layer 149 may be sequentially stacked on the first non-magnetic layer 130. The first junction magnetic layer 141 and the second junction magnetic layer 149 may include a soft magnetic material. When a magnetic memory cell operates, one of the first junction magnetic layer 141 and the second junction magnetic layer 149 may serve as a reference layer and the other may serve as a free layer. The junction magnetic layer serving as a free layer may have a saturation magnetization smaller than that of the junction magnetic layer serving as a reference layer.

A second non-magnetic layer 150 may be disposed on the second junction magnetic layer 149. The second non-magnetic layer 150 may be formed with a thin thickness. For example, the second non-magnetic layer 150 may be formed to have a thickness in a range of about 2 Å (Angstroms) to about 20 Å (Angstroms). The second non-magnetic layer 150 may not have a texture.

A second vertical magnetic layer 164 is disposed on the second non-magnetic layer 150. The second vertical magnetic layer 164 may be configured such that it has a magnetization direction vertical to planes of a first junction magnetic layer and a second junction magnetic layer 141, 149 constituting the magnetic tunnel junction. The second vertical magnetic layer 164 may be exchange coupled with the second junction magnetic layer 149 by the second non-magnetic layer 150. For example, the second vertical magnetic layer 164 may include an amorphous RE-TM alloy. A capping layer 170 may be disposed on the second vertical magnetic layer 164.

Figure 4A:
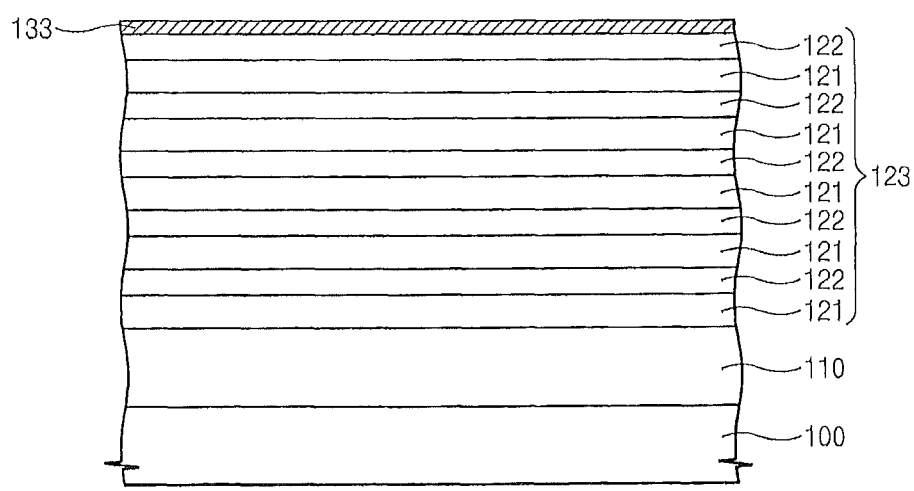
FIGS. 4A through 4C are views describing a method for a magnetic memory device according to first embodiments of inventive concepts.
Figure 4B:
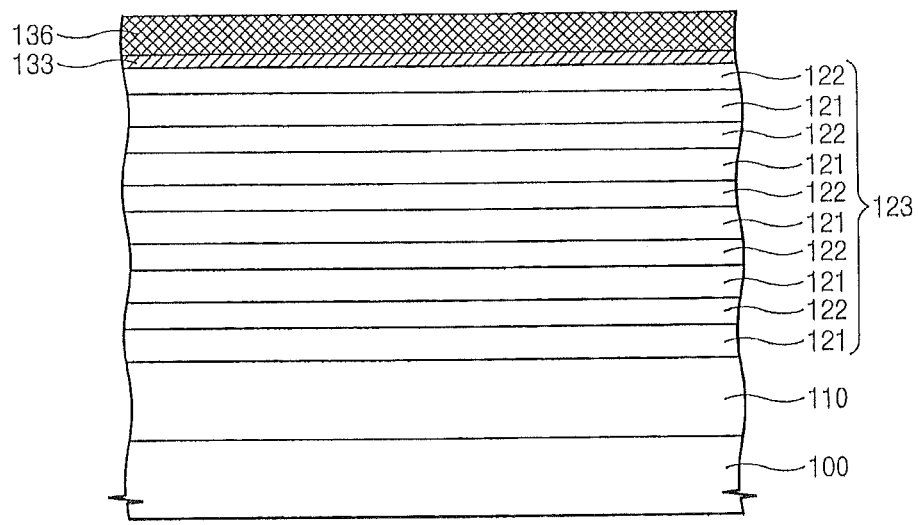
Figure 4C:
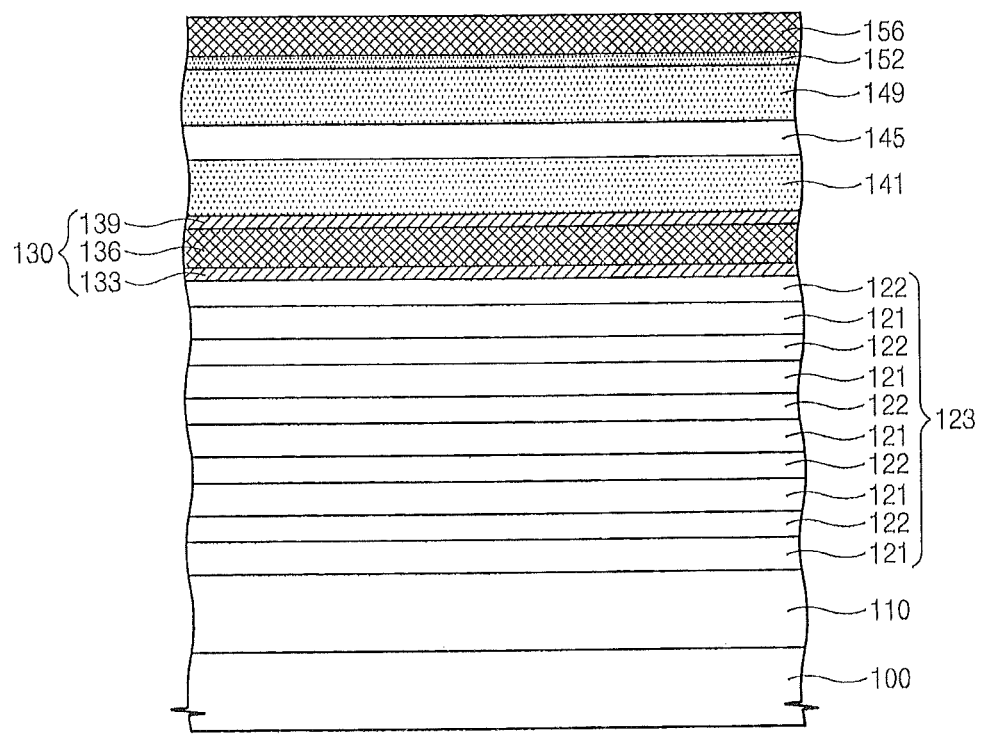

Referring to FIGS. 4A and 4C and FIG. 1, a method for forming a magnetic memory device according to embodiments of inventive concepts will be described. Some of the description with reference to FIG. 1 may be omitted.

Referring to FIG. 4A, a lower electrode 110 may be formed on a substrate 100. The lower electrode 110 may be formed on the substrate 100 and/or in the substrate 100.

Non-magnetic layers 121 and ferromagnetic layers 122 may be alternately stacked on the lower electrode 110. The stacking numbers of the non-magnetic layers 121 and the ferromagnetic layers 122 may be in a range of about 2 to about 20 times. The ferromagnetic layers 122 may be formed with a thickness of one to several atoms. The non-magnetic layers 121 and ferromagnetic layers 122 may constitute a first vertical magnetic layer 123.

Referring to FIG. 4B, a first lower metal compound layer 133 may be formed on the first vertical magnetic layer 123. A metal layer may be thinly formed on the first vertical magnetic layer 123, followed by oxidation and/or nitridation to form the first lower metal compound layer 133. The metal layer may include at least one selected from, for example, transition metals.

A first non-magnetic metal layer 136 may be formed on the first lower metal compound layer 133. The first non-magnetic metal layer 136 may include at least one selected from non-magnetic metals, for example, non-magnetic transition metals. For example, the first non-magnetic metal layer 136 and the first lower metal compound layer 133 may include at least one selected from the group consisting of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobdenum (Nb), zirconium (Zr), yttrium (Y), and/or hafnium (Hf). The first non-magnetic metal layer 136 may include a metal identical to the first lower metal compound layer 133.

Referring to FIG. 4C, a first upper metal compound layer 139 is formed on the first non-magnetic metal layer 136. The first upper metal compound layer 139 may be formed by oxidation or nitridation of a top face of the first non-magnetic metal layer 136. For the oxidation or nitridation, a small amount of oxidation gas and/or nitridation gas may be provided on a top face of the first upper metal compound layer 139. Conversely, a separate metal layer may be formed on the first non-magnetic metal layer 136, followed by oxidation and/or nitridation to form the first upper metal compound layer 139 or a separate metal compound layer may be deposited to form the first upper metal compound layer 139.

A first junction magnetic layer 141, a tunnel barrier 145, and a second junction magnetic layer 149 may be sequentially formed on the first upper metal compound layer 139. The first junction magnetic layer 141 and the second junction magnetic layer 149 may include a soft magnetic material. In an embodiment, the first junction magnetic layer 141 and the second junction magnetic layer 149 may include materials having saturation magnetizations different from each other. The first and second junction magnetic layers 149 may be formed in an amorphous state. In an embodiment, a process for oxidizing a top portion of the first junction magnetic layer 149 may be further included.

The tunnel barrier 145 may include at least one selected from the group consisting of magnesium (Mg), titanium (Ti), aluminum (Al), an oxide of magnesium-zinc (MgZn) and/or magnesium-boron (MgB), and/or a nitride of titanium (Ti) and/or vanadium (V). Conversely, the tunnel barrier 145 may include a plurality of layers. The plurality of layers may be at least two layers selected from the group consisting of metal layers, metal oxide layers, metal nitride layers, and/or metal oxynitride layers. The tunnel barrier 145 may have a predetermined crystal structure, for example, a NaCl-type crystal structure.

A second junction magnetic layer 149 may be formed on the tunnel barrier 145. When the second junction magnetic layer 149 is used as a free layer of a magnetic memory cell, the second junction magnetic layer 149 may have a saturation magnetization smaller than that of the first junction magnetic layer 141. Alternatively, the iron (Fe) content of the second junction magnetic layer 149 may be greater than or at least equal to that of the first junction magnetic layer 141.

A top face of the second junction magnetic layer 149 may be oxidized and/or nitrided. A pre-lower metal compound layer 152 may be thereby formed in a top portion of the second junction magnetic layer 149. A top face of the second junction magnetic layer 149 may be oxidized and/or nitrided in the same manner as in the top face of the first non-magnetic metal layer 136. Conversely, an oxidation and/or nitridation process of the second junction magnetic layer 149 may be omitted.

A second non-magnetic metal layer 156 may be formed on the second junction magnetic layer 149 and the pre-lower metal compound layer 152. The second non-magnetic metal layer 156 may include at least one selected from the group consisting of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobdenum (Nb), zirconium (Zr), yttrium (Y), and/or hafnium (Hf).

Referring again to FIG. 1, a second upper metal compound layer 159 is formed on the second non-magnetic metal layer 156. The second upper metal compound layer 159 may be formed by oxidation or nitridation of a top face of the second non-magnetic metal layer 156. For the oxidation or nitridation, a small amount of oxidation gas and/or nitridation gas may be provided on a top face of the second upper metal compound layer 159. Conversely, a separate metal layer may be formed on the second non-magnetic metal layer 156, followed by oxidation and/or nitridation to form the second upper metal compound layer 159 or a separate metal compound layer may be deposited to form the second upper metal compound layer 159.

Non-magnetic layers 161 and ferromagnetic layers 162 may be alternately stacked on the second upper metal compound layer 159. The ferromagnetic layers 162 may be formed with a thickness of one to several atoms. The non-magnetic layers 161 and the ferromagnetic layers 162 may be included in a second vertical magnetic layer 163. The stacking numbers of the non-magnetic layers 161 and ferromagnetic layers 162 in the second vertical magnetic layer 163 may be different from those of the non-magnetic layers 121 and ferromagnetic layers 122 in the first vertical magnetic layer 123.

Prior to and/or after a formation of the second vertical magnetic layer 163, an annealing process may be performed. Through the annealing process, the amorphous first and second junction magnetic layers 141, 149 may be crystallized into a seed layer of the tunnel barrier 145. The annealing process may be a magnetic annealing process or another annealing process. As the tunnel barrier 145 serves as a seed layer, the tunnel barrier 145 may have a crystal structure similar to those of the first and second junction layers 141, 149. Alternatively, faces of the first and second junction layers 141, 149, contacting the tunnel barrier 145, may have crystal planes equal to the face of the tunnel barrier. For example, when top and bottom faces of the tunnel barrier 145 correspond to a (001) crystal plane of a NaCl-type crystal structure, faces of the first and second junction magnetic layers 141, 149, contacting the tunnel barrier 145, may be a (001) crystal plane of a body centered cubic structure.

During the annealing, the first and second non-magnetic layers 130, 150 may prevent the crystallization of the first and second junction magnetic layers 141, 149 along the crystal structure of layers different from the tunnel barrier 145. For example, when the first and second non-magnetic layers 130, 150 are omitted, the crystallization of the first and second junction magnetic layers 141, 149 may be affected by the first and second vertical magnetic layers 123, 163. In this case, the first and second junction magnetic layers 141, 149 may not have crystal structures and/or crystal planes equal to those of the tunnel barrier 145. When the first and second junction magnetic layers 141, 149 have crystal structures and/or crystal planes different from those of the tunnel barrier 145, the resistance ratio of the magnetic tunnel junction including these may be significantly reduced. However, when first and second non-magnetic layers 130, 150 are interposed between the first vertical magnetic layer 123 and the first junction magnetic layer 141 and/or between the second vertical magnetic layer 163 and the second junction magnetic layer 140 according to embodiments of inventive concepts, the first and second vertical magnetic layers 123, 163 may not serve as a seed layer for crystallization of the first and second junction magnetic layers 141, 149. Accordingly, the crystal structures of the first and second junction magnetic layers 141, 149 may align with crystal structure of the tunnel barrier 145. Therefore, the magnetoresistance ratio of a magnetic tunnel junction including these may be enhanced.

A capping layer 170 may be formed on the second vertical magnetic layer 163. The capping layer 170 may include at least one selected from the group consisting of tantalum (Ta), aluminum (Al), copper (Cu), gold (Au), silver (Ag), titanium (Ti), ruthenium (Ru), magnesium (Mg), tantalum nitride (TaN), and/or titanium nitride (TiN).

The first vertical magnetic layer 123, the first non-magnetic layer 130, the first junction magnetic layer 141, the tunnel barrier 145, the second junction magnetic layer 149, the second non-magnetic layer 150, the second vertical magnetic layer 163, and the capping layer 170 may be patterned. The patterning may be performed by one selected from various patterning processes including photolithography and/or electron beam patterning. The patterning may be performed after all the layers are formed, or after some of the layers are formed. When only some of the layers are patterned, an additional patterning may be performed after the others of the layers are formed.

Referring to FIG. 2, a method for forming a modified example of a magnetic memory device according to embodiments of inventive concepts will be described. Description of methods for forming elements described with reference to FIG. 1 is omitted.

A seed layer 115 may be formed on a substrate 100. The seed layer 115 may include a single metal layer or a plurality of metal layers. The seed layer 115 may include a metal layer having a predetermined crystal structure. For example, the seed layer 115 may have at least one crystal structure selected from the group consisting of body-centered cubic lattice (BCC), face-centered cubic lattice (FCC), and hexagonal close packing (HCP) lattice.

A first vertical magnetic layer 124 may be formed on the seed layer 115. The first vertical magnetic layer 124 may be deposited using the seed layer 115 as a seed. The first vertical magnetic layer 124 deposited using the seed layer 115 as a seed may have a HCP or an L10 crystal structure. When the first vertical magnetic layer 124 is formed of an amorphous RE-TM alloy, the seed layer 115 may be omitted.

Referring to FIG. 3, a method for forming a modified example of a magnetic memory device according to embodiments of inventive concepts will be described. Description of methods for forming elements described with reference to FIGS. 1 and 2 is omitted.

A second vertical magnetic layer 164 is formed on a second non-magnetic layer 150. The second vertical magnetic layer 164 may include, for example, an amorphous RE-TM alloy. While not shown, the second vertical magnetic layer 164 may include a plurality of ferromagnetic layers. A non-magnetic metal layer may be interposed between the ferromagnetic layers. The second vertical magnetic layer 164 may be modified in various shapes within the scope of ferromagnetic material layers having a vertical magnetization direction.

A Second Embodiment

Figure 5:
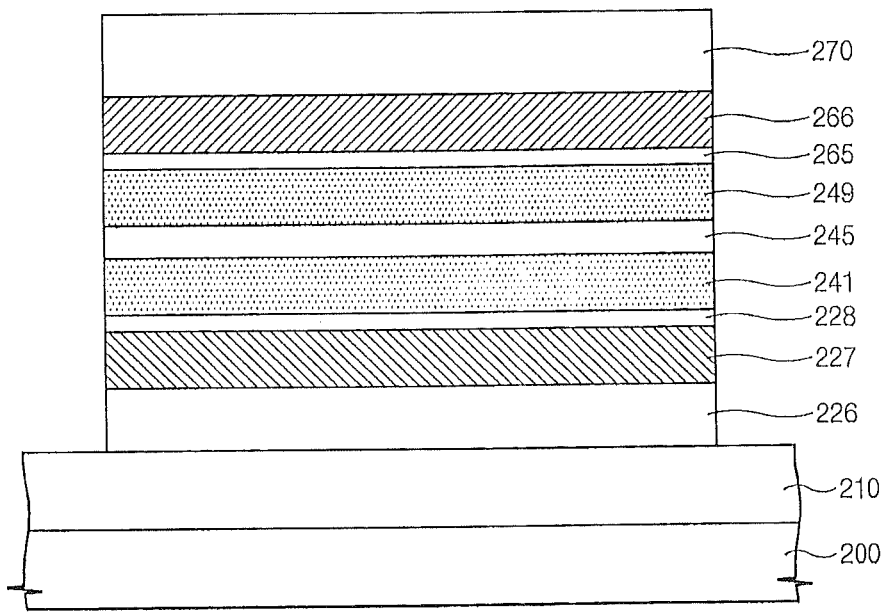
FIG. 5 is a view illustrating a magnetic memory device according to second embodiments of inventive concepts.

Referring to FIG. 5, a magnetic memory device according to second embodiments of inventive concepts will be described.

A lower electrode 210 is disposed on a substrate 200. The substrate 200 may be a semiconductor-based semiconductor substrate. The substrate 200 may include a conductive region and/or an insulating region. The lower electrode 210 may be electrically connected to the conductive region of the substrate 200. The lower electrode 210 may be disposed on the substrate 200 and/or in the substrate 200. The lower electrode 210 may have any selected from the group consisting of a line, island, and/or plate.

A pinning layer 226 is disposed on the lower electrode 210. The pinning layer may include an antiferromagnetic material. For example, the pinning layer 226 may include at least one selected from the group consisting of PtMn, IrMn, FeMn, NiMn, MnO, MnS, MnTe, $MnF_2$, $FeF_2$, $FeCl_2$, FeO, $CoCl_2$, CoO, $NiCl_2$, NiO, and/or Cr. The pinning layer 226 may fix the magnetization direction of an adjacent magnetic layer in one direction.

A lower reference layer 227 may be provided on the pinning layer 226. The lower reference layer 227 may include a ferromagnetic material. For example, the lower reference layer 227 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, EuO, and/or $Y_3Fe_5O_{12}$. The magnetization direction of the lower reference layer 227 may be fixed to one direction by the pinning layer 226. The one direction may be selected from directions parallel to the plane of the substrate 200. For another example, the lower reference layer 227 may include at least one selected from the group consisting of a material with an L10 crystal structure, a material with a HCP, and an amorphous RE-TM alloy. In this case, the magnetization direction of the lower reference layer 227 may be vertical (perpendicular) to the plane of the substrate 200.

A reference exchange-coupling layer 228 may be disposed on the lower reference layer 227. The reference exchange-coupling layer 228 may include at least one selected from the group consisting of ruthenium (Ru), iridium (Ir), chromium (Cr), and/or rhodium (Rh).

An upper reference layer 241 may be formed on the reference exchange-coupling layer 228. The upper reference layer 241 may include iron (Fe). The upper reference layer 241 may include at least one selected from the group consisting of cobalt (Co) and/or nickel (Ni). The upper reference layer 241 may further include at least one from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and/or nitrogen (N). The upper reference layer 241 may be exchange-coupled with the lower reference layer 227 by the reference exchange-coupling layer 228.

A tunnel barrier 245 may be formed on the upper reference layer 241. The tunnel barrier 245 may include a non-magnetic material. The tunnel barrier 245 may include at least one selected from the group consisting of magnesium (Mg), titanium (Ti), aluminum (Al), an oxide of magnesium-zinc (MgZn) and/or magnesium-boron (MgB), and/or a nitride of titanium (Ti) and/or vanadium (V). For example, the tunnel barrier 245 may be a magnesium oxide (MgO) layer. Conversely, the tunnel barrier 245 may include a plurality of layers including a metal layer and a metal compound layer.

The tunnel barrier 245 may have a crystal structure similar to that of the upper reference layer 241. For example, the tunnel barrier 245 and the upper reference layer 241 may have a NaCl-type crystal structure and a body-centered cubic structure, respectively. The interface between the tunnel barrier 245 and the upper reference layer 241 may include identical crystal planes. For example, the (001) crystal plane of the tunnel barrier 245 may include the (001) crystal plane of the upper reference layer 241.

A lower free layer 249 may be disposed on the tunnel barrier 245. The lower free layer 249 may include iron (Fe). The lower free layer 249 may include at least one selected from the group consisting of cobalt (Co) and/or nickel (Ni). The upper reference layer 241 may further include at least one from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and/or nitrogen (N).

The iron (Fe) content in the lower free layer 249 may be higher than that in the upper reference layer 241. The reliability of a magnetic memory cell including the upper reference layer 241 and the lower free layer 249 may be enhanced by the high iron content in the lower free layer 249. When the iron content in the reference layer is high between the reference layer and the free layer constituting a magnetic tunnel junction, the magnetic memory cell including the magnetic tunnel junction may show an abnormal switching behavior. In one example, the magnetization direction of a free layer including a relatively low iron content may not be maintained in a direction parallel to the magnetization direction of the reference layer. Accordingly, when the magnetic memory cell is switched into a parallel state (a state in which the magnetization direction of the free layer is parallel to the magnetization direction of the reference layer), the magnetization direction of the free layer may be abnormally reversed. The reliability of a magnetic memory cell including the free layer may be degraded by these abnormal switching phenomena. However, the lower free layer 249 may have a higher iron content than the upper reference layer 241 according to embodiments of inventive concepts. Accordingly, the magnetization direction of the lower free layer 249 in a switching action of a magnetic memory cell into a parallel state may be stably maintained in a state parallel to the magnetization direction of the upper reference layer 241. The magnetization direction of the lower free layer 249 may not be abnormally reversed. Therefore, the reliability of a magnetic memory cell including the lower free layer 249 may be enhanced.

A free exchange-coupling layer 265 may be disposed on the lower free layer 249. The free exchange-coupling layer 265 may include at least one selected from the group consisting of ruthenium (Ru), iridium (Ir), chromium (Cr), and/or rhodium (Rh).

An upper free layer 266 may be disposed on the free exchange-coupling layer 265. The upper free layer 266 may include a ferromagnetic material. For example, the upper free layer 266 may include at least one selected from the group consisting of CoFeB, Fe, Co, Ni, Gd, Dy, CoFe, NiFe, MnAs, MnBi, MnSb, $CrO_2$, $MnOFe_2O_3$, FeOFe2O3, $NiOFe_2O_3$, $CuOFe_2O_3$, EuO, and/or $Y_3Fe_5O_{12}$. When a magnetic memory cell operates, the magnetization direction of the upper free layer 266 may be changed into a first direction or a second direction parallel to the plane of the substrate 200. For another example, the upper free layer 266 may include at least one selected from amorphous RE-TM alloys. In this case, the magnetization direction of the upper free layer 266 may be changed into a first direction or a second direction vertical to the plane of the substrate 200 when a magnetic memory cell operates. The upper free layer 266 may be exchange coupled with the lower free layer 249 by the free exchange-coupling layer 265.

A capping layer 270 is disposed on the upper free layer 266. The capping layer 270 may include at least one selected from the group consisting of tantalum (Ta), aluminum (Al), copper (Cu), gold (Au), silver (Ag), titanium (Ti), tantalum nitride (TaN), and/or titanium nitride (TiN).

While not shown, positions of the lower and upper free layers 249, 266 and the lower and upper reference layers 227, 241 may be changed. For example, the lower and upper free layers 249, 266 may be disposed under the tunnel barrier 245, and the lower and upper reference layers 227, 241 may be disposed over the tunnel barrier 245. In this case, an upper free layer 266, a free exchange-coupling layer 265, and a lower free layer 249 may be sequentially stacked between the lower electrode 210 and the tunnel barrier 245, while an upper reference layer 241, a reference exchange-coupling layer 228, and a lower reference layer 227 may be sequentially stacked between the tunnel barrier 245 and the capping layer 270.

Figure 6:
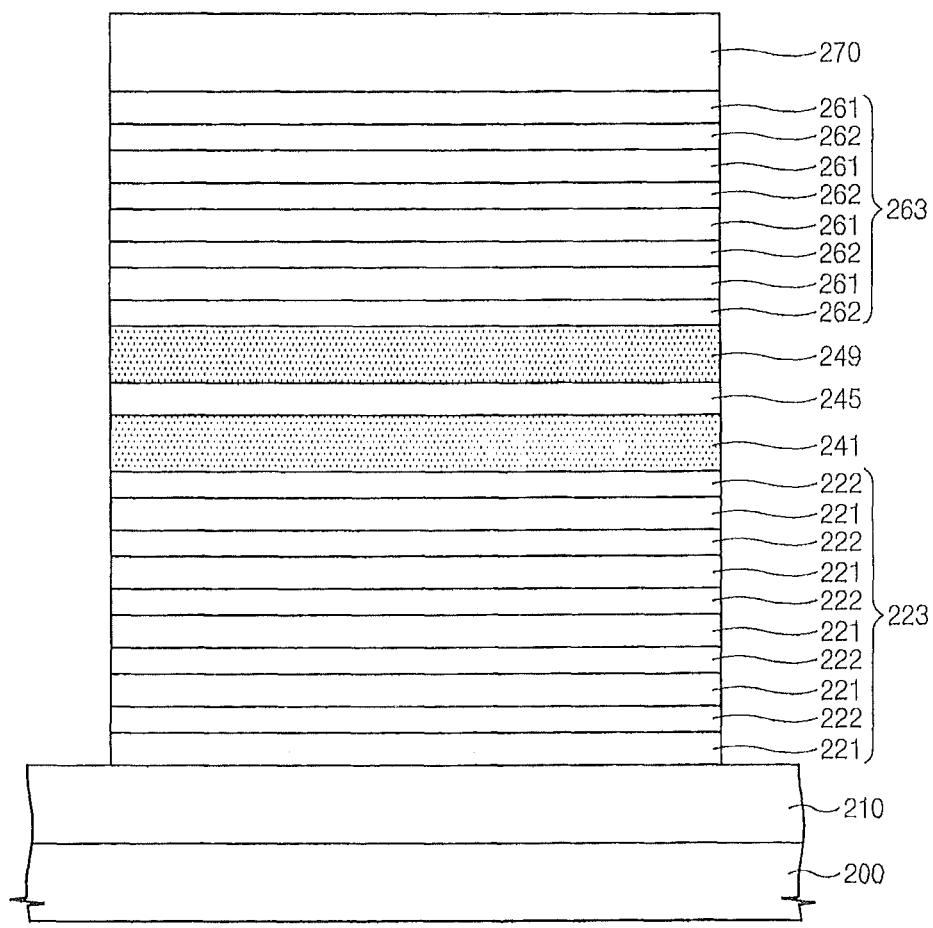
FIG. 6 is a view illustrating a modified example of a magnetic memory device according to second embodiments of the inventive concepts.

Referring to FIG. 6, a modified example of a magnetic memory device according to second embodiments of inventive concepts will be described. Description of elements described with reference to FIG. 5 may be omitted.

A vertical lower reference layer 223 may be disposed on a lower electrode 210. The vertical lower reference layer 223 may include non-magnetic layers 221 and ferromagnetic layers 222 alternately stacked. The ferromagnetic layers 222 may include at least one selected from the group consisting of iron (Fe), cobalt (Co), and/or nickel (Ni), while the non-magnetic layers 121 may include at least one selected from the group consisting of chromium (Cr), platinum (Pt), palladium (Pd), iridium (Ir), ruthenium (Ru), rhodium (Rh), osmium (Os), rhenium (Re), gold (Au), and/or copper (Cu). For example, the vertical lower reference layer 223 may include [Co/Pt]m, [Co/Pd]m, or [Ni/Pt]m (m is a stacking number of each layer and a natural number of 2 or more). In some embodiments, the non-magnetic layers 221 and ferromagnetic layers 222 may be stacked about 2 to about 20 times, respectively. When the current flows in a direction vertical to the substrate 200 and the planes of the vertical lower reference layers 223, the vertical lower reference layer 223 may be configured such that it has a magnetization direction parallel to the current. For this configuration, the ferromagnetic layers 222 may be thinly formed with a thickness of one to several atomic layers.

A vertical upper free layer 263 may be disposed on a lower free layer 249. The vertical upper free layer 263 may include non-magnetic layers 261 and ferromagnetic layers 262 alternately stacked. The ferromagnetic layers 262 may include at least one selected from the group consisting of iron (Fe), cobalt (Co), and/or nickel (Ni), while the non-magnetic layers 261 may include at least one selected from the group consisting of chromium (Cr), platinum (Pt), palladium (Pd), iridium (Ir), ruthenium (Ru), rhodium (Rh), osmium (Os), rhenium (Re), gold (Au), and/or copper (Cu). For example, the vertical upper free layer 263 may include [Co/Pt]n, [Co/Pd]n, and/or [Ni/Pt]n (n is a stacking number of each layer and a natural number of 2 or more). In some embodiments, the non-magnetic layers 261 and ferromagnetic layers 262 may be stacked about 2 to about 20 times, respectively. The stacking number n of non-magnetic layers 261 and ferromagnetic layers 262 in the vertical upper free layer 263 may be smaller than the stacking number m of non-magnetic layers 221 and ferromagnetic layers 222 in the vertical lower reference layer 223.

Referring again to FIG. 5, a method for forming a magnetic memory device according to second embodiments of inventive concepts will be described. A lower electrode 210 is formed on a substrate 200. The lower electrode 210 may be formed on the substrate 200 and/or in the substrate 200.

A pinning layer 226 is formed on the lower electrode 210. The pinning layer 226 may include an anti-ferromagnetic material. In some embodiments, a seed layer may be formed as a substitute for the pinning layer 226. The seed layer may include a metal with a predetermined crystal structure, or a metal alloy.

A lower reference layer 227 may be formed on the pinning layer 226. The lower reference layer 227 may include a ferromagnetic material. For example, the lower reference layer 227 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, EuO, and/or $Y_3Fe_5O_{12}$. For another example, the lower reference layer 227 may include at least one selected from the group consisting of a material with an L10 crystal structure, a material with a hexagonal close packing (HCP) lattice, and an amorphous RE-TM alloy.

A reference exchange-coupling layer 228 may be formed on the lower reference layer 227. The reference exchange-coupling layer 228 may include at least one selected from the group consisting of ruthenium (Ru), iridium (Ir), chromium (Cr), and/or rhodium (Rh).

An upper reference layer 241, a tunnel barrier 245, and a lower free layer 249 may be formed on the reference exchange-coupling layer 228. The upper reference layer 241 and the lower free layer 249 may be formed in an amorphous state, while the tunnel barrier 245 may be formed in a NaCl-type crystal state. The crystal structure of the upper reference layer 241 and the lower free layer 249 may align with the crystal structure of the tunnel barrier 245 by a subsequent annealing process.

A free exchange-coupling layer 265 may be formed on the lower free layer 249. The reference exchange-coupling layer 228 may include at least one selected from the group consisting of ruthenium (Ru), iridium (Ir), chromium (Cr), and/or rhodium (Rh).

An upper free layer 266 may be formed on the free exchange-coupling layer 265. The upper free layer 266 may include a ferromagnetic material. A capping layer 270 may be formed on the upper free layer 266.

Layers stacked on the lower electrode 210 are patterned. The patterning may be performed by at least one selected from various patterning processes including photolithography and electron beam. The patterning may be performed after all the layers are formed, or after some of the layers are formed. When only some of the layers are patterned, an additional patterning may be performed after the others of the layers are formed.

Referring to FIG. 6, a method for forming a modified example of a magnetic memory device according to second embodiments of inventive concepts will be described. Description of methods for forming elements previously described in FIG. 5 is omitted.

Non-magnetic layers 221 and ferromagnetic layers 222 may be alternately stacked on a lower electrode 210. The ferromagnetic layers 222 may be deposited with a thickness of one to several atoms. The non-magnetic layers 221 and ferromagnetic layers 222 formed on the lower electrode 210 may constitute a vertical lower reference layer 223.

Non-magnetic layers 261 and ferromagnetic layers 262 may be alternately stacked on the lower free layer 249. The ferromagnetic layers 262 may be formed with a thickness of one to several atoms. Non-magnetic layers 221 and ferromagnetic layers 222, formed on the lower free layer 249, may constitute a vertical upper free layer 263.

The stacking number of the non-magnetic layers 221 and the ferromagnetic layers 222 in the vertical lower reference layer 223 may be greater than the stacking number of the non-magnetic layers 261 and the ferromagnetic layers 262 in the vertical upper free layer 262.

Third Embodiment

Figure 7:
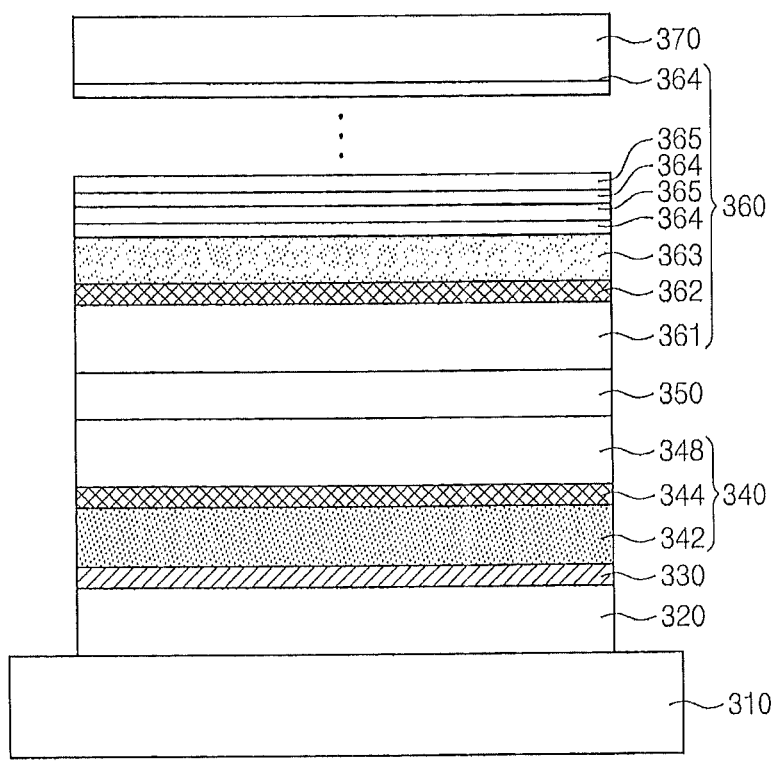
FIG. 7 is a view illustrating a magnetic memory device according to third embodiments of inventive concepts.

Referring to FIG. 7, a magnetic memory device according to third embodiments of inventive concepts will be described. A lower electrode 320 is disposed on a substrate 310. The substrate 310 may be any one selected from various substrates including a semiconductor element-based substrate and a metal compound-based substrate. The substrate 310 may include a conductive region and/or an insulating region. Although the lower electrode 320 is illustrated as being disposed on the substrate 310, the electrode may be included in the substrate 310. The lower electrode 320 may be an electrode or electrode contact. The lower electrode 320 may be electrically connected to the conductive region in the substrate 310. For example, the lower electrode 320 may be electrically connected to at least one selected from switching devices including a transistor and a diode included in the substrate 310.

Figure 9:
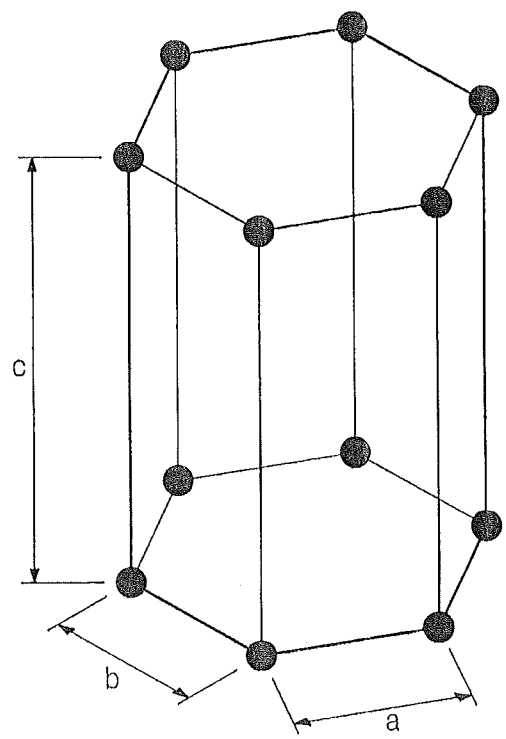
FIG. 9 is a view describing a crystal structure according to third embodiments of inventive concepts.

A seed layer 330 is disposed on the substrate 310. The seed layer 330 may include metal atoms constituting a hexagonal close-packing (HCP) lattice. As illustrated in FIG. 9, the HCP may be a lattice including three a-axes, three b-axes constituting a hexagonal plane with the a-axes, and c-axes substantially vertical to the hexagonal plane. A hexagonal plane constituted by the a-axes and b-axes may be substantially parallel to the plane of the substrate 310, while the c-axes may be substantially vertical to the plane of the substrate 310. The (001) crystal plane of a crystal structure constituting the seed layer 330 may be parallel to the plane of the substrate 310. The seed layer 330 may be thinly formed. For example, the seed layer 330 may be formed to have a thickness in a range of about 10 Å (Angstroms) to about 100 Å (Angstroms). The seed layer 330 may include ruthenium (Ru) and/or titanium (Ti). Conversely, the seed layer 330 may include metal atoms constituting a face-centered cubic (FCC) lattice. For example, the seed layer 330 may include platinum (Pt), palladium (Pd), gold (Au), silver (Ag), copper (Cu), and/or aluminum (Al).

A free magnetic substance 340 may be disposed on the seed layer 330. The free magnetic substance 340 may include a vertical free magnetic layer 342 contacting the seed layer 330 and a junction free magnetic layer 348 on the vertical free magnetic layer 342. Unlike the illustration, the vertical free magnetic substance 342 and the junction free magnetic layer 348 may include a plurality of layers.

The vertical free magnetic layer 342 may include a ferromagnetic material. Atoms included in the vertical free magnetic layer 342 may constitute a HCP lattice. As illustrated in FIG. 9, the HCP lattice of the vertical free magnetic layer 342 may include an a-axis, a b-axis, and a c-axis. The c-axis of the HCP lattice constituting the vertical free magnetic layer 342 may be substantially vertical to the plane of the substrate 310. The (001) plane of the HCP lattice constituting the vertical free magnetic layer 342 may be parallel to the plane of the substrate 310. The easily magnetized axis of the vertical free magnetic layer 342 may be the c-axis. Accordingly, the magnetization direction of the vertical free magnetic layer 342 may be vertical to the substrate 310. The vertical free magnetic layer 342 may have a magnetic anisotropy in a direction vertical to the plane of the substrate 310.

The ferromagnetic properties and the lattice structure of the vertical free magnetic layer 342 may be due to kinds of atoms constituting the vertical free magnetic layer 342 and/or the content of the atoms.

In some embodiments, the vertical free magnetic layer 342 may include a disordered cobalt-platinum alloy having a platinum content in a range of about 10% to about 45% by atomic percent. The platinum atom content in the vertical free magnetic layer 342 may be in a range of about 20% to about 30% by atomic percent. The vertical free magnetic layer 342 may further include a non-magnetic material. For example, the vertical free magnetic layer 342 may further include at least one selected from the group consisting of boron (B), chromium (Cr), and/or copper (Cu).

In other embodiments, the vertical free magnetic layer 342 may include $Co_3Pt$ which is an ordered alloy. The vertical free magnetic layer 342 may further include a non-magnetic material. For example, the vertical free magnetic layer 342 may further include at least one selected from the group consisting of boron (B), chromium (Cr), silicon (Si), and/or copper (Cu).

In other embodiments, the vertical free magnetic layer 342 may be formed in the form of a plurality of layers. In this case, the vertical free magnetic layer 342 may include a first free ferromagnetic layer having a HCP lattice and a second free ferromagnetic layer on the first free ferromagnetic layer, which are sequentially stacked on the seed layer 330. The first free ferromagnetic layer may be one selected from embodiments of the vertical free magnetic layer 342 previously described, while the second free ferromagnetic layer may be an alloy including at least one selected from the group consisting of iron (Fe), cobalt (Co), and/or nickel (Ni) and at least one selected from rare-earth metals. For example, the rare-earth metal may be at least one selected from the group consisting of terbium (Tb), dysprosium (Dy), and/or gadolinium (Gd). Conversely, the second free ferromagnetic layer may be at least one selected from ferromagnetic materials with a L10 crystal structure including $Fe_{50}Pt_{50}$, $Fe_{50}Pd_{50}$, $Co_{50}Pt_{50}$, $Co_{50}Pd_{50}$, and/or $Fe_{50}Ni_{50}$.

The vertical free magnetic layer 342 may have a high vertical magnetic anisotropy by a crystal structure of the vertical free magnetic layer 342, that is, a HCP lattice structure of the vertical free magnetic layer 342. In the specification, the vertical magnetic anisotropy means a magnetic anisotropy in a direction vertical to the plane of the substrate 310. The reliability of a magnetic memory device including the vertical free magnetic layer 342 may be enhanced and the operating power of the magnetic memory may be reduced by the high vertical magnetic anisotropy. Specifically, the spin direction of many electrons among electrons transmitting through the vertical free magnetic layer 342 may be aligned in a direction vertical to the plane of the substrate 310 by the vertical free magnetic layer 342. Accordingly, many electrons among electrons transmitting through the vertical free magnetic layer 342 may be substantially used in the write operation of the magnetic memory device. Therefore, the reliability of a magnetic memory device may be enhanced, and the magnetic memory device may be operated using a relatively small amount of a switching current.

A lower exchange-coupling control layer 344 may be disposed on the vertical free magnetic layer 342. The lower exchange-coupling control layer 344 may include a magnetic material with a large exchange-coupling constant or a non-magnetic material which may increase the surface magnetic anisotropy. For example, the lower exchange-coupling control layer 344 may include at least one from iron (Fe), cobalt (Co), and/or nickel (Ni), which have a large exchange coupling constant. The lower exchange-coupling control layer 344 may further include platinum (Pt). The thickness of the lower exchange-coupling control layer 344 may be in a range of about 2 Å (Angstroms) to about 20 Å (Angstroms). The lower exchange-coupling control layer 344 may reinforce an exchange-coupling between the vertical free magnetic layer 342 and a junction free magnetic layer 348 which will be described. Because the vertical free magnetic layer 342 has a high magnetic anisotropy in a direction vertical to the plane of the substrate 310, the junction free magnetic layer 348 exchange-coupled by the vertical free magnetic layer 342 and the lower exchange-coupling control layer 344 may also have a high magnetic anisotropy in a direction vertical to the plane of the substrate 310.

For another example, the lower exchange-coupling control layer 344 may include at least one selected from metal elements including a transition metal. The lower exchange-coupling control layer 344 may include at least one selected from non-magnetic metals including titanium (Ti), chromium (Cr), ruthenium (Ru), rhodium (Rh), copper (Cu), magnesium (Mg), zinc (Zn), aluminum (Al), tantalum (Ta), palladium (Pd), and/or platinum (Pt). Accordingly, the lower exchange-coupling control layer 344 may increase the vertical magnetic anisotropy of the surface of the adjacent magnetic layers.

In an embodiment, the lower exchange-coupling control layer 344 may further include an oxide layer on the surface of the lower exchange-coupling control layer 344. The oxide layer may be an oxide of a material constituting the surface of the lower exchange-coupling control layer 344.

A junction free magnetic layer 348 may be disposed on the lower exchange-coupling control layer 344. The junction free magnetic layer 348 may have a high vertical anisotropy by the lower exchange-coupling control layer 344 and/or the vertical free magnetic layer 342. For example, the junction free magnetic layer 348 may be strongly exchange-coupled by the vertical free magnetic layer 342 and the lower exchange-coupling control layer 344, which have a high vertical anisotropy. For another example, the vertical magnetic anisotropy of the surface of the junction free magnetic layer 348 may be enhanced by the lower exchange-coupling control layer 344 including the non-magnetic metals.

The junction free magnetic layer 348 may include a soft magnetic material. The junction free magnetic layer 348 may have a low damping constant and a high spin polarization ratio. For example, the junction free magnetic layer 348 may include cobalt (Co), iron (Fe), and/or nickel (Ni) atoms. The junction free magnetic layer 348 may further include at least one from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and/or nitrogen (N). Specifically, the junction free magnetic layer 348 may include CoFe and/or NiFe, and may further include boron (B). To further decrease the saturation magnetization of the junction free magnetic layer 348, the junction free magnetic layer 348 may further include at least one selected from the group consisting of titanium (Ti), aluminum (Al), silicon (Si), magnesium (Mg), tantalum (Ta), and/or silicon (Si). As the saturation magnetization decreases, the switching current of a magnetic memory cell including the junction free magnetic layer 348 may be decreased.

While not shown, the junction free magnetic layer 348 may include a plurality of magnetic layers. For example, the junction free magnetic layer 348 may include a first free ferromagnetic layer, a free non-magnetic layer, and a second free ferromagnetic layer, that is, a synthetic anti-ferromagnet (SAF) layer, which are sequentially stacked on the lower exchange-coupling magnetic layer 344. The junction free magnetic layer 348 may include magnetic layers having a changeable magnetization direction in various shapes.

The magnetization direction of at least one layer from a plurality of layers constituting the free magnetic substance 340 may be changed. For example, the junction free magnetic layer 348 may have a changeable magnetization direction. The magnetization direction of the junction free magnetic layer 348 may be changed into a first direction vertical to the substrate 310 or into a second direction anti-parallel to the first direction by electric and/or magnetic factors provided from the outside of the junction free magnetic layer 348.

A tunnel barrier 350 may be disposed on the free magnetic substance 340. The tunnel barrier 350 may have a thickness thinner than the spin diffusion distance. The tunnel barrier 350 may include a non-magnetic material. In some embodiments, the tunnel barrier 350 may be formed of an insulating material layer. For example, the tunnel barrier 350 may include at least one selected from the group consisting of magnesium (Mg)/magnesium oxide (MgO), magnesium oxide (MgO)/magnesium (Mg), and/or magnesium (Mg)/magnesium oxide (MgO)/magnesium (Mg).

A reference magnetic substance 360 may be formed on the tunnel barrier 350. The reference magnetic substance 360 may include a junction reference magnetic layer 361, an upper exchange-coupling control layer 362, and the vertical reference magnetic layer 363, which are sequentially stacked on the tunnel barrier 350. A plurality of upper reference non-magnetic layers 364 and reference ferromagnetic layers 365 may be alternately stacked on the vertical reference magnetic layer 363.

The junction reference magnetic layer 361 may include a soft magnetic material. For example, the junction reference magnetic layer 361 include cobalt (Co), iron (Fe), and/or nickel (Ni), and the contents of the atoms may be determined such that the saturation magnetization of the junction reference magnetic layer 361 may be lowered. The junction reference magnetic layer 361 may have a low damping constant and a high spin polarization ratio. For this purpose, the junction reference magnetic layer 361 may further include at least one from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and/or nitrogen (N). For example, the junction reference magnetic layer 361 may include CoFe and/or NiFe, and may further include boron. Furthermore, the junction reference magnetic layer 361 may further include at least one selected from non-magnetic elements including titanium (Ti), aluminum (Al), silicon (Si), magnesium (Mg), and/or tantalum (Ta). The content of the selected non-magnetic element in the junction reference magnetic layer 361 may be in a range of about 1% to about 15% by atomic percent.

The junction free magnetic layer 348, the tunnel barrier 350, and the junction reference magnetic layer 361 may constitute a magnetic tunnel junction. A magnetic memory cell according to embodiments of inventive concepts may store data by using the difference of resistance values whether the magnetization directions of two magnetic substances constituting the magnetic tunnel junction, the junction free magnetic layer 348 and the junction reference magnetic layer 361, are parallel or anti-parallel to each other. Specifically, according to directions of electrons transmitting through the magnetic tunnel junction, the magnetization direction of the junction free magnetic layer 348 may be changed.

For example, when electrons move in a direction from the junction free magnetic layer 348 to the junction reference magnetic layer 361, electrons having a spin in a first direction of the magnetization direction parallel to that of the junction reference magnetic layer 361 may transmit through the junction reference magnetic layer 361, while electrons having a spin in a second direction of the magnetization anti-parallel to that of the junction reference magnetic layer 361 may not transmit through the junction reference magnetic layer 361 (e.g., are reflected) and are transferred to the junction free magnetic layer 348. The magnetization direction of the junction free magnetic layer 348 may be a second direction by electrons having a spin in the second direction. Accordingly, the junction reference magnetic layer 361 and the junction free magnetic layer 348 may have a magnetization direction anti-parallel to each other. A magnetic tunnel junction constituted by magnetic substances having magnetization directions anti-parallel to each other may have a relatively high resistance value. In present embodiments, the first direction and the second direction may be directions substantially vertical (perpendicular) to the plane of the substrate 310.

For another example, when electrons move from the junction reference magnetic layer 361 to the junction free magnetic layer 348, electrons having a spin in a first direction, transmitting through the junction reference magnetic layer 361 may arrive at the junction free magnetic layer 348. The magnetization direction of the junction free magnetic layer 348 may be changed into the first direction by electrons having a spin in the first direction, which have arrived at the junction free magnetic layer 348. Accordingly, the junction reference magnetic layer 361 and junction free magnetic layer 348 may have a magnetization direction in a first direction. A magnetic tunnel junction constituted by magnetic substances having magnetization directions parallel to each other may have a relatively low resistance value.

In this way, the resistance values of the magnetic tunnel junction may be varied according to the direction of electrons flowing through the magnetic tunnel junction. Data may be stored into the magnetic memory cell by using the difference of the resistance values.

An upper exchange-coupling control layer 362 may be disposed on the junction reference magnetic layer 361. The upper exchange-coupling control layer 362 may include a material with a large exchange-coupling constant, for example, a ferromagnetic metal, or a material which may control the orientation of an adjacent magnetic substance, for example, a non-magnetic metal. For example, the upper exchange-coupling control layer 362 may include at least one selected from the group consisting of iron (Fe), cobalt (Co), and/or nickel (Ni). For another example, the upper exchange-coupling control layer 364 may include at least one selected from the group consisting of titanium (Ti), chromium (Cr), ruthenium (Ru), rhodium (Rh), copper (Cu), magnesium (Mg), zinc (Zn), aluminum (Al), tantalum (Ta), palladium (Pd), and/or platinum (Pt). In some embodiments, the upper exchange-coupling control layer 362 may further include an oxide layer on the surface of the upper exchange-coupling control layer 362. The oxide layer may be a layer formed by oxidation of some of the upper exchange-coupling control layer 362. The function and constitution of the upper exchange-coupling control layer 362 may be substantially identical to those of the lower exchange-coupling control layer 344.

A vertical reference magnetic layer 363 may be disposed on the upper exchange-coupling control layer 362. The vertical reference magnetic layer 363 may include a ferromagnetic material. The atoms constituting the vertical reference magnetic layer 363 may constitute a crystal structure having an easily magnetized axis substantially vertical to the plane of the substrate 310. For example, the vertical reference magnetic layer 363 may include a cobalt (Co) and/or platinum (Pt) ordered alloy or disordered alloy, and the c-axis of the HCP lattice may be vertical to the plane of the substrate 310. Accordingly, the vertical anisotropy of the vertical reference magnetic layer 363 may be significantly enhanced. The vertical reference magnetic layer 363 may further include at least one selected from the group consisting of boron (B), chromium (Cr), silicon (Si), and/or copper (Cu).

An upper reference magnetic layer 364, 365 may be disposed on the upper exchange-coupling control layer 363. The upper reference magnetic layer 364, 365 may include reference non-magnetic layers 364 and reference ferromagnetic layers 365 alternately stacked. The reference non-magnetic layer 364 may include at least one selected from the group consisting of iron (Fe), cobalt (Co), and/or nickel (Ni), while the reference ferromagnetic layers 365 may include at least one selected from the group consisting of chromium (Cr), platinum (Pt), palladium (Pd), iridium (Ir), ruthenium (Ru), rhodium (Rh), osmium (Os), rhenium (Re), gold (Au), and/or copper (Cu). For example, the upper reference magnetic layer 364, 365 may include [Co/Pb]n, [Co/Pt]n, or [Ni/Pt]n (n is a natural number of 2 or more). The stacking numbers of the reference non-magnetic layers 364 and reference ferromagnetic layers 365 may be in a range of about 2 to about 11 times. The reference ferromagnetic layers 365 may be formed with a very thin thickness. For example, the reference ferromagnetic layers 365 may be formed with an atomic layer thickness. The magnetization direction of the reference ferromagnetic layer 365 may be vertical to the plane of the substrate 310.

The upper reference magnetic layer 364, 365 may be disposed in different shapes. For example, the upper reference magnetic layer 364, 365 may include a first reference ferromagnetic layer, a reference non-magnetic layer, and a second reference ferromagnetic layer, that is, a synthetic anti-ferromagnet (SAF) layer, which are sequentially stacked on the vertical reference magnetic layer 363.

A capping layer 370 may be disposed on the upper reference magnetic layer 364, 365. The capping layer 370 may include at least one selected from the group consisting of tantalum (Ta), aluminum (Al), copper (Cu), gold (Au), silver (Ag), titanium (Ti), tantalum nitride (TaN), and/or titanium nitride (TiN).

Figure 8:
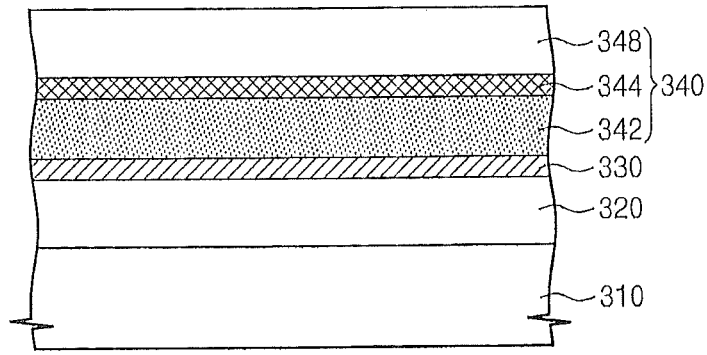
FIG. 8 is a view describing a method for a magnetic memory device according to third embodiments of inventive concepts.

Referring to FIGS. 7 and 8, a method for forming a magnetic memory device according to third embodiments of inventive concepts will be described. Description previously described may be omitted with reference to FIG. 7.

Referring to FIG. 8, a lower electrode 320 is formed on a substrate 310. The lower electrode 320 may include a metal or a metal compound.

A seed layer 330 is formed on the lower electrode 320. The seed layer 330 may include metals with a HCP lattice or a FCC lattice. For example, the seed layer 330 may include at least one selected from the group consisting of ruthenium (Ru), titanium (Ti), platinum (Pt), palladium (Pd), gold (Au), silver (Ag), copper (Cu), and/or aluminum (Al). The seed layer 330 may be formed with a relatively thin thickness. For example, the seed layer 330 may be formed to have a thickness in a range of about 2 Å (Angstroms) to about 20 Å (Angstroms).

A vertical free magnetic layer 342 is formed on the seed layer 330. The crystal structure of the vertical free magnetic layer 342 may align with the crystal structure of the seed layer 330. For example, the vertical free magnetic layer 342 may be formed with a HCP lattice equal to the crystal structure of the seed layer 330. The vertical free magnetic layer 342 may include cobalt (Co) and/or platinum (Pt). The vertical free magnetic layer 342 may include an ordered alloy or a disordered alloy of the cobalt (Co) and the platinum (Pt).

The vertical free magnetic layer 342 grown by using the seed layer 330 as a seed may be formed by a relatively low temperature process. For example, the vertical free magnetic layer 342 formed by using the seed layer 330 as a seed may be deposited at room temperature.

In the case of a magnetic memory device with the magnetization direction of magnetic substances vertical to a substrate, a magnetic substance having a crystal structure with a large vertical anisotropy, for example, a ferromagnetic substance constituted by an L10 ordered alloy is used. In order to form a ferromagnetic substance with the L10 ordered alloy, a plurality of seed layers including a chromium (Cr) seed layer with a FCC lattice and a platinum (Pt) seed layer with a BCC lattice may be required. The plurality of layers are formed more thickly than a single seed layer. Therefore, the size of a device including the seed layer may be increased. During a patterning process of the seed layer, other magnetic layer and insulation layers may be contaminated by etching by-products of the seed layer. In particular, when a tunnel barrier to be subsequently described is contaminated by etching by-products of the seed layer, a shorting phenomenon may occur on the tunnel barrier to degrade the function of a memory. Furthermore, the L10 ordered alloy may be formed using a high-temperature deposition process of 400° C. or higher and/or using a high-temperature annealing process of 600° C. or higher.

Conversely, when a vertical free magnetic layer 342 with a HCP lattice is formed according to embodiments of the inventive concept, the seed layer 330 may be formed as a single layer. Accordingly, the thickness of the seed layer 330 may be thinner than those of a plurality of layers. The crystal structure of the vertical free magnetic layer 342 may have a high dependence on the seed layer 330. Accordingly, the vertical free magnetic layer 342 according to embodiments of the inventive concept may align with the crystal structure of the seed layer 330 even at a low process temperature. That is, a high-temperature deposition process or high-temperature annealing process may not be essential.

A lower exchange-coupling control layer 344 may be formed on the vertical free magnetic layer 342. The lower exchange-coupling control layer 344 may include a ferromagnetic metal with a large exchange-coupling constant, for example, at least one selected from metals including iron (Fe), cobalt (Co), and/or nickel (Ni). Conversely, the lower exchange-coupling control layer 344 may include a non-magnetic material which may enhance the surface magnetic anisotropy of an adjacent magnetic substance or control the crystal orientation of a magnetic substance to be formed on the lower exchange-coupling control layer 344. For example, the lower exchange-coupling control layer 344 may include at least one selected from the group consisting of titanium (Ti), chromium (Cr), ruthenium (Ru), rhodium (Ru), copper (Cu), magnesium (Mg), zinc (Zn), aluminum (Al), tantalum (Ta), palladium (Pd), and/or platinum (Pt). In some embodiments, the surface of the lower exchange-coupling control layer 344 may be oxidized. A process for the oxidation may include an injection of an infinitesimal amount of oxygen into a chamber where a product in which the vertical free magnetic layer 342 has been formed is loaded prior to a formation of the lower exchange-coupling control layer 344, or an oxidation layer may be formed by injection of an infinitesimal amount of oxygen into the chamber after a formation of the lower exchange-coupling control layer 344 with an atomic layer thickness and then a formation of the rest lower exchange-coupling control layer 344.

A junction free magnetic layer 348 may be formed on the lower exchange-coupling control layer 344. The vertical anisotropy of the junction free magnetic layer 348 may be enhanced by the vertical free magnetic layer 342 and/or the lower exchange-coupling control layer 344. Specifically, the crystallization of the junction free magnetic layer 348 into the crystal structure of the vertical free magnetic layer 342 may be prevented and/or reduced by the crystal structure of the lower exchange-coupling control layer 344. For example, when the lower exchange-coupling control layer 344 is omitted, the junction free magnetic layer 348 formed in an amorphous state may be crystallized into the crystal structure of the vertical free magnetic layer 342 by a heating process. In this case, the crystal structure of the junction free magnetic layer 348 may be aligned by the crystal structure of the vertical free magnetic layer 342, that is, an (011) crystal plane other than a (001) crystal plane of a BCC structure, and then the magnetoresistance ratio of a magnetic tunnel junction including the junction free magnetic layer 348 may be decreased. However, because the vertical free magnetic layer 342 is separated from the junction free magnetic layer 348 by the lower exchange-coupling control layer 344, the crystal structure of the junction free magnetic layer 348 may not align with the crystal structure of the vertical free magnetic layer 342.

Accordingly, the magnetoresistance ratio of a magnetic tunnel junction may be enhanced.

Referring again to FIG. 7, a tunnel barrier 350 may be formed on the junction free magnetic layer 348. The tunnel barrier may include at least one selected from the group consisting of magnesium (Mg), titanium (Ti), aluminum (Al), an oxide of magnesium-zinc (MgZn) and/or magnesium-boron (MgB), and/or a nitride of titanium (Ti) and/or vanadium (V). For example, the tunnel barrier 350 may be a magnesium oxide (MgO) layer. Conversely, the tunnel barrier 350 may include a plurality of layers. For example, the tunnel barrier may include magnesium (Mg)/magnesium oxide (MgO), magnesium oxide (MgO)/magnesium (Mg), and/or magnesium (Mg)/magnesium oxide (MgO)/magnesium (Mg). The tunnel barrier 350 may be formed by deposition of the metal oxide or metal nitride on the junction free magnetic layer 348 or formation of a metal layer on the junction free magnetic layer 348, and then oxidation of the metal layer. In an embodiment, the tunnel barrier 350 may have a predetermined crystal structure. For example, the tunnel barrier 350 may have a NaCl-type crystal structure (face-centered cubic lattice structure).

A junction reference magnetic layer 361 may be formed on the tunnel barrier 350. The junction reference magnetic layer 361 may have a relatively low saturation magnetization. The junction reference magnetic layer 361 may include a soft magnetic material. The junction reference magnetic layer 361 may further include a non-magnetic material. The junction reference magnetic layer 361 may have magnetic properties equal to those of the junction free magnetic layer 348. Conversely, the junction reference magnetic layer 361 may have magnetic properties different from those of the junction free magnetic layer 348. For example, the product of the thickness of the junction reference magnetic layer 361 and the saturation magnetization of the junction reference magnetic layer 361 may be larger than that of the thickness of the junction free magnetic layer 348 and the saturation magnetization of the junction free magnetic layer 348.

The crystal structure of the junction reference magnetic layer 361 may align with the tunnel barrier 350. For example, when the tunnel barrier 350 is formed of a magnesium oxide (MgO) having a (001) crystal plane of a NaCl (face-centered cubic lattice) structure parallel to the plane of the substrate 310, the junction reference magnetic layer 361 may align with the crystal structure of the tunnel barrier 350. Accordingly, the vertical magnetic anisotropy of the junction reference magnetic layer 361 may be enhanced. The crystallization of the junction reference magnetic layer 361 may be performed by a heating process.

An upper exchange-coupling control layer 362 may be formed on the junction reference magnetic layer 361. The upper exchange-coupling control layer 362 may include a magnetic material with a large exchange-coupling constant. Accordingly, an exchange-coupling between the vertical reference magnetic layer 363 and the magnetic junction reference magnetic layer 361 may be enhanced to increase the vertical magnetic anisotropy of the junction reference magnetic layer 361. The upper exchange-coupling control layer 362 may serve as a seed layer and may be aligned such that an easily magnetized axis of the vertical reference magnetic layer 363 is vertical to the plane of the substrate 310. In some embodiments, the surface of the upper exchange-coupling control layer 362 may be oxidized. A process for the oxidation may include an injection of an infinitesimal amount of oxygen into a chamber where a product in which the upper junction reference magnetic layer 361 has been formed is loaded prior to a formation of the upper exchange-coupling control layer 362, or an oxidation layer may be formed by injection of an infinitesimal amount of oxygen into the chamber after a formation of the upper exchange-coupling control layer 362 with an atomic layer thickness and then a formation of the rest upper exchange-coupling control layer 362.

A vertical reference magnetic layer 363 may be formed on the junction reference magnetic layer 361. The vertical reference magnetic layer 363 may be an amorphous ferromagnetic layer. For example, the vertical reference magnetic layer 363 may be formed of an amorphous cobalt (Co) and/or platinum (Pt) alloy. The vertical reference magnetic layer 363 may include at least one selected from the group consisting of boron (B), chromium (Cr), silicon (Si), and/or copper (Cu).

An upper reference magnetic layer 364, 365 may be formed on the vertical reference magnetic layer 363. Reference non-magnetic layers 364 and reference ferromagnetic layers 365 may be alternately stacked a plurality of times to form the upper reference magnetic layer 364, 365. The reference ferromagnetic layers 365 may be formed with a very thin thickness. For example, the reference ferromagnetic layers 365 may be formed with an atomic layer thickness.

The upper reference magnetic layer 364, 365 may be formed in various forms. For example, the upper reference magnetic layer 364, 365 may include a first reference ferromagnetic layer, a reference non-magnetic layer, and a second reference ferromagnetic layer, that is, a synthetic anti-ferromagnet (SAF) layer, which are sequentially stacked on the vertical reference magnetic layer 363.

As the vertical reference magnetic layer 363 and/or the upper exchange-coupling control layer 362 are(is) interposed between the reference non-magnetic layer 364 and the junction reference magnetic layer 361, the magnetoresistance ratio of a magnetic tunnel junction including the junction reference magnetic layer 361 may be enhanced. Specifically, when the reference non-magnetic layer 364 is directly formed on the junction reference magnetic layer 361, a metal constituting the reference non-magnetic layer 364 may react with a material constituting the reference magnetic layer 361 during a heating process to form a layer which does not have magnetic properties. The magnetoresistance ratio of the magnetic tunnel junction may be significantly reduced by the layer which does not have magnetic properties.

In some embodiments, the junction reference magnetic layer 361 may be thinly formed with a thickness equal to or smaller than a predetermined critical thickness. In this case, the junction reference magnetic layer 361 may be consumed by reaction with the reference non-magnetic layer 364 to reduce the magnetoresistance ratio. Conversely, because the vertical reference magnetic layer 363 and/or the upper exchange-coupling control layer 364 are(is) formed between the vertical reference magnetic layer 361 and the reference non-magnetic layer 364 according to embodiments of inventive concepts, a layer which does not have magnetic properties may not be formed. Accordingly, the junction reference magnetic layer 361 is not unnecessarily consumed. Therefore, the magnetoresistance ratio of a magnetic tunnel junction including the junction reference magnetic layer 361 may be enhanced.

A capping layer 370 may be formed on the upper reference magnetic layer 364, 365. The capping layer 370 may include at least one selected from the group consisting of tantalum (Ta), aluminum (Al), copper (Cu), gold (Au), silver (Ag), titanium (Ti), tantalum nitride (TaN), and/or titanium nitride (TiN).

Layers stacked on the substrate 310 may be patterned. The patterning may be performed after all the layers from the lower electrode 310 to the capping layer 370 are stacked, or the patterning of some layers may be performed prior to the stacking of the other layers. The patterning may be performed using an ion beam process and/or a photolithography process. The patterning may include the performing an anisotropy etching process.

Fourth Embodiment

Figure 10:
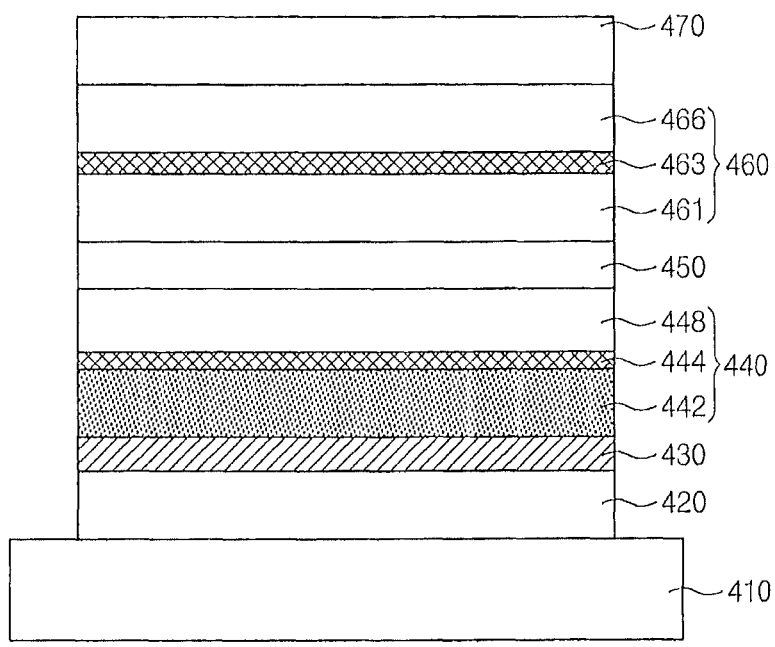
FIG. 10 is a view illustrating a magnetic memory device according to the fourth embodiments of the inventive concepts.

Referring to FIG. 10, a magnetic memory device according to fourth embodiments of inventive concepts will be described. A lower electrode 420 is disposed on a substrate 410. The substrate 410 may include a conductive region and/or an insulating region. The lower electrode 420 may be electrically connected to the conductive region in the substrate 410.

A seed layer 430 is disposed on the lower electrode 420. The seed layer 430 may include metal atoms constituting a HCP lattice. The HCP c-axes may be substantially vertical to the plane of the substrate 410.

A reference magnetic substance 440 may be disposed on the seed layer 430. The reference magnetic substance 440 may include a vertical reference magnetic layer 442, a lower exchange-coupling control layer 444, and/or a junction reference magnetic layer 448, which are sequentially stacked on the seed layer 430.

The vertical reference magnetic layer 442 may include a ferromagnetic material. The vertical reference magnetic layer 442 may have an easily magnetized axis in a direction vertical to the substrate 410. For example, the vertical reference magnetic layer 442 may include a hexagonal close-packing (HCP) lattice. As illustrated in FIG. 9, the hexagonal close-packing (HCP) lattice of the vertical reference magnetic layer 442 may include an a-axis, a b-axis, and a c-axis. The c-axis of the HCP lattice constituting the vertical reference magnetic layer 442 may be substantially parallel to the c-axis constituting the seed layer 430. The c-axis of the HCP lattice constituting the vertical reference magnetic layer 442 may be substantially vertical to the plane of the substrate 410. The easily magnetized axis of the vertical reference magnetic layer 442 may be the c-axis. Accordingly, the magnetization direction of the vertical reference magnetic layer 442 may be vertical to the substrate 410.

In an embodiment, the vertical reference magnetic layer 442 may include a cobalt-platinum (CoPt) disordered alloy having a platinum content in a range of about 10% to about 45% by atomic percent. The platinum atomic content in the vertical reference magnetic layer 442 may be in a range of about 20% to about 30% by atomic percent. The vertical reference magnetic layer 442 may further include a non-magnetic material. For example, the vertical reference magnetic layer 442 may further include at least one selected from the group consisting of boron (B), chromium (Cr), and/or copper (Cu).

In another embodiment, the vertical reference magnetic layer 442 may include $Co_3Pt$ which is an ordered alloy. The vertical reference magnetic layer 442 may further include a non-magnetic material. For example, the vertical reference magnetic layer 442 may further include at least one selected from the group consisting of boron (B), chromium (Cr), silicon (Si), and/or copper (Cu).

In still another embodiment, the vertical reference magnetic layer 442 may include a plurality of layers. In this case, the vertical reference magnetic layer 442 may include a first reference ferromagnetic layer having a HCP lattice and a second reference ferromagnetic layer on the first reference ferromagnetic layer, which are sequentially stacked on the seed layer 430. The first reference ferromagnetic layer may be one selected from various embodiments of the vertical reference magnetic layer 442 as previously described, while the second reference ferromagnetic layer may be an alloy including at least one selected from the group consisting of iron (Fe), cobalt (Co), and/or nickel (Ni) and at least one selected from rare earth metals. For example, the rare earth metal may be at least one selected from the group consisting of terbium (Tb), dysprosium (Dy), and/or gadolinium (Gd). Conversely, the second reference ferromagnetic layer may be at least one selected from ferromagnetic materials with a L10 crystal structure including $Fe_{50}Pt_{50}$, $Fe_{50}Pd_{50}$, $Co_{50}Pt_{50}$, $Co_{50}Pd_{50}$, and/or $Fe_{50}Ni_{50}$. The vertical reference magnetic layer 442 may have a high vertical anisotropy by the HCP structure of the vertical reference magnetic layer 442. Accordingly, the resistance dispersion and switching current properties of a magnetic memory device including the vertical reference magnetic layer 442 may be improved.

A lower exchange-coupling control layer 444 may be disposed on the vertical reference magnetic layer 442. The lower exchange-coupling control layer 444 may include a magnetic material with a large exchange-coupling constant or a non-magnetic material which may increase the surface magnetic anisotropy. For example, the lower exchange-coupling control layer 444 may include at least one from iron (Fe), cobalt (Co), and/or nickel (Ni), which have a large exchange coupling constant. The lower exchange-coupling control layer 444 may further include platinum (Pt). The thickness of the lower exchange-coupling control layer 444 may be in a range of about 2 Å (Angstroms) to about 20 Å (Angstroms). The lower exchange-coupling control layer 444 may reinforce an exchange-coupling between the vertical reference magnetic layer 442 and a junction reference magnetic layer 448 which will be described. Because the vertical reference magnetic layer 442 has a high vertical anisotropy as previously described, the junction reference magnetic layer 448 exchange-coupled by the vertical reference magnetic layer 442 and the lower exchange-coupling control layer 444 may also have a high vertical anisotropy.

For another example, the lower exchange-coupling control layer 444 may include at least one selected from non-magnetic metals including titanium (Ti), chromium (Cr), ruthenium (Ru), rhodium (Rh), copper (Cu), magnesium (Mg), zinc (Zn), aluminum (Al), tantalum (Ta), palladium (Pd), and/or platinum (Pt). The non-magnetic metals may control the orientation of the crystal structures of adjacent magnetic layers. In some embodiments, the lower exchange-coupling control layer 444 may further include an oxidation layer on the surface of the lower exchange-coupling control layer 444. The oxidation layer may be a layer where the surface of the lower exchange-coupling control layer 444 is oxidized. The surface magnetic anisotropy of the adjacent magnetic layers may be enhanced by the lower exchange-coupling control layer 444.

A tunnel barrier 450 may be formed on the junction reference magnetic layer 448. The tunnel barrier 450 may include at least one selected from the group consisting of magnesium (Mg), titanium (Ti), aluminum (Al), an oxide of magnesium-zinc (MgZn) and/or magnesium-boron (MgB), and/or a nitride of titanium (Ti) and/or vanadium (V). The tunnel barrier 450 may include a plurality of layers. For example, the tunnel barrier 450 may include magnesium (Mg)/magnesium oxide (MgO), magnesium oxide (MgO)/magnesium (Mg), and/or magnesium (Mg)/magnesium oxide (MgO)/magnesium (Mg).

A free magnetic substance 460 may be disposed on the tunnel barrier 450. The free magnetic substance 460 may include a junction free magnetic layer 461 contacting the tunnel barrier 450, an exchange-coupling control layer 463 on the junction free magnetic layer 461, and an upper free magnetic layer 466 on the upper exchange-coupling control layer 463.

The junction free magnetic layer 461 may include a soft magnetic material. The junction free magnetic layer 461 may have a low saturation magnetization. The junction free magnetic layer 461 may also have a low damping constant and a high spin polarization ratio. The junction free magnetic layer 461 may include at least one selected from the group consisting of cobalt (Co), iron (Fe), and/or nickel (Ni). The junction free magnetic layer 461 may further include at least one from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and/or nitrogen (N).

For example, the junction free magnetic layer 461 may include CoFe and/or NiFe, and may further include boron (B). Furthermore, the junction free magnetic layer 461 may further include at least one selected from non-magnetic elements including titanium (Ti), aluminum (Al), silicon (Si), magnesium (Mg), and/or tantalum (Ta). The content of the selected non-magnetic element in the junction free magnetic layer 461 may be in a range of about 1% to about 15% by atomic percent.

An upper exchange-coupling control layer 463 may be disposed on the junction free magnetic layer 461. The upper exchange-coupling control layer 463 may include a material with a large exchange-coupling constant, for example, a ferromagnetic material, or a material which may increase the orientation and vertical anisotropy of an adjacent magnetic substance, for example, a non-magnetic metal. For example, the upper exchange-coupling control layer 463 may include at least one selected from the group consisting of iron (Fe), cobalt (Co), and/or nickel (Ni). For another example, the upper exchange-coupling control layer 463 may include at least one selected from the group consisting of titanium (Ti), chromium (Cr), ruthenium (Ru), copper (Cu), magnesium (Mg), zinc (Zn), aluminum (Al), tantalum (Ta), palladium (Pd), and/or platinum (Pt). In some embodiments, the upper exchange-coupling control layer 463 may further include an oxidation layer contacting the upper exchange-coupling control layer 463. The oxidation layer may be an oxide of some of the upper exchange-coupling control layer 463.

The upper free magnetic layer 466 may include a single magnetic layer or a plurality of magnetic layers. For example, the upper free magnetic layer 466 may include a first free ferromagnetic layer, a free non-magnetic layer, and a second free ferromagnetic layer, that is, a synthetic anti-ferromagnet (SAF) layer, which are sequentially stacked on the upper exchange-coupling control layer 463. The upper free magnetic layer 466 may include magnetic layers having a changeable magnetization direction in various shapes.

A capping layer 470 is disposed on the upper free magnetic layer 466. The capping layer may include at least one selected from the group consisting of tantalum (Ta), aluminum (Al), copper (Cu), gold (Au), silver (Ag), titanium (Ti), tantalum nitride (TaN), and/or titanium nitride (TiN).

Referring to FIG. 10, a method for forming a magnetic memory device according to fourth embodiments of inventive concepts will be described. Further discussion of previously described elements may be omitted for the sake of conciseness.

Referring again to FIG. 10, a lower electrode 420 and a seed layer 430 are formed on a substrate 410. The seed layer 430 may include metals with a HCP lattice or a FCC lattice. For example, the seed layer 430 may include at least one selected from the group consisting of ruthenium (Ru), titanium (Ti), platinum (Pt), palladium (Pd), gold (Au), silver (Ag), copper (Cu), and/or aluminum (Al). The seed layer 430 may be formed with a relatively thin thickness. For example, the seed layer 430 may be formed to have a thickness in a range of about 10 Å (Angstroms) to about 100 Å (Angstroms).

A vertical reference magnetic layer 442 is formed on the seed layer 430. The vertical reference magnetic layer 442 may include a material which has a large dependence on the seed layer 430. For example, the crystal structure of the vertical reference magnetic layer 442 may align with the crystal structure of the seed layer 430. For example, the vertical reference magnetic layer 442 may be grown along the c-axis of the seed layer 430. Accordingly, the vertical reference magnetic layer 442 grown by using the seed layer 430 as a seed may be formed through a relatively low temperature process.

For example, the vertical reference magnetic layer 442 may include cobalt (Co) and/or platinum (Pt). The vertical reference magnetic layer 442 may include an ordered alloy or a disordered alloy according to the cobalt (Co) and platinum (Pt) contents. For example, the vertical reference magnetic layer 442 formed using the seed layer 330 as a seed may be deposited at room temperature.

A lower exchange-coupling control layer 444 may be formed on the vertical magnetic layer 442. The lower exchange-coupling control layer 444 may include a ferromagnetic metal with a large exchange-coupling constant, for example, at least one selected from metals including iron (Fe), cobalt (Co), and/or nickel (Ni). Conversely, the lower exchange-coupling control layer 444 may increase the surface magnetic anisotropy of an adjacent magnetic substance. For example, the lower exchange-coupling control layer 444 may include a non-magnetic material, for example, a non-magnetic metal element or a transition metal. The lower exchange-coupling control layer 444 may include at least one selected from the group consisting of titanium (Ti), chromium (Cr), ruthenium (Ru), rhodium (Rh), copper (Cu), magnesium (Mg), zinc (Zn), aluminum (Al), tantalum (Ta), palladium (Pd), and/or platinum (Pt).

In some embodiments, the surface of the lower exchange-coupling control layer 444 may be oxidized. A process for the oxidation may include an injection of an infinitesimal amount of oxygen into a chamber where a product in which the vertical magnetic layer 442 has been formed is loaded prior to a formation of the lower exchange-coupling control layer 444, or a formation of an oxidation layer by injection of an infinitesimal amount of oxygen into the chamber after a formation of the lower exchange-coupling control layer 444 with an atomic layer thickness and then a formation of the rest lower exchange-coupling control layer 444.

A junction reference magnetic layer 448 may be formed on the lower exchange-coupling control layer 444. The vertical anisotropy of the junction reference magnetic layer 448 may be enhanced by the vertical reference magnetic layer 442 and/or the lower exchange-coupling control layer 444.

A tunnel barrier 450 is formed on the junction reference magnetic layer 448. The tunnel barrier 450 may include at least one selected from the group consisting of magnesium (Mg), titanium (Ti), aluminum (Al), an oxide of magnesium-zinc (MgZn) and/or magnesium-boron (MgB), and/or a nitride of titanium (Ti) and/or vanadium (V). Conversely, the tunnel barrier 450 may include a plurality of layers. For example, the tunnel barrier 450 may include magnesium (Mg)/magnesium oxide (MgO), magnesium oxide (MgO)/magnesium (Mg), and/or magnesium (Mg)/magnesium oxide (MgO)/magnesium (Mg). In an embodiment, the tunnel barrier 450 may have a NaCl-type structure (body-centered cubic lattice structure). For example, the tunnel barrier 450 may include magnesium oxide (MgO).

A junction free magnetic layer 461 is formed on the tunnel barrier 450. The junction free magnetic layer 461 may have a relatively low saturation magnetization. The junction free magnetic layer 461 may further include a non-magnetic material. The junction free magnetic layer 461 may be formed in an amorphous state.

An upper exchange-coupling control layer 463 may be formed on the junction free magnetic layer 461. In an embodiment, the junction free magnetic layer 461 may include a magnetic material with a large exchange-coupling constant. Accordingly, as the exchange coupling between the junction free magnetic layer 461 and an upper reference magnetic layer 466 to be subsequently described increases, the vertical anisotropy of the junction free magnetic layer 461 may be increased. Specifically, when the upper exchange coupling control layer is formed on the junction free magnetic layer 461, the crystal structure of the junction free magnetic layer 461 may not be crystallized into the crystal structure of upper free magnetic layer 466 to be subsequently described, but may align with the crystal structure of the tunnel barrier 450. As the junction free magnetic layer 461 aligns with the crystal structure of the tunnel barrier 450, the magnetoresistance ratio of a magnetic tunnel junction including the junction free magnetic layer 461 may be enhanced. In an embodiment, the interface between the upper exchange-coupling control layer 463 and the junction free magnetic layer 461 may be oxidized. A process for the oxidation may be performed by an injection of an infinitesimal amount of oxygen into a chamber where the substrate 410 on which the upper junction free magnetic layer 461 has been formed is loaded after a formation of the upper junction free magnetic layer 461, or a formation of an oxide by injection of an infinitesimal amount of oxygen into the chamber after a formation of the exchange-coupling control layer 463 with an atomic layer thickness and then a formation of the rest exchange-coupling control layer 463.

An upper free magnetic layer 466 may be formed on the upper exchange-coupling control layer 463. The upper free magnetic layer 466 may include a single layer including a ferromagnetic material or a plurality of layers including the single layer. In an embodiment, the upper free magnetic layer 466 may include a ferromagnetic layer-antiferromagnetic layer-ferromagnetic layer structure.

A capping layer 470 may be formed on the upper exchange-coupling control layer 463. The capping layer 470 may include at least one selected from the group consisting of tantalum (Ta), aluminum (Al), copper (Cu), gold (Au), silver (Ag), titanium (Ti), tantalum nitride (TaN), and/or titanium nitride (TiN).

According to some embodiments of the inventive concept, as a non-magnetic layer is intervened between a vertical magnetic layer and a junction magnetic layer, a magnetoresistance ratio and a vertical magnetization property of a magnetic tunnel junction including the junction magnetic layer can improve. In addition, during operation of the magnetic memory device, switching properties can improve through a free magnetic layer and a reference magnetic layer which have respectively different contents of iron. Accordingly, reliability of the magnetic memory device can improve.

According to other embodiments of the inventive concept, a magnetic layer can have a hexagonal close packing (HCP) lattice having an axis which is vertical to the plane of the substrate 100 and easily magnetized. Accordingly, directions of spins of electrons can be arrayed to a perpendicular direction with respect to the substrate. Therefore, a magnetoresistance ratio of a magnetic tunnel junction can improve. In addition, switching current of the magnetic memory device including a magnetic tunnel junction can be decreased.

The above-disclosed subject matter is to be considered illustrative and not restrictive, and the appended claims are intended to cover all such modifications, enhancements, and other embodiments, which fall within the true spirit and scope of inventive concepts disclosed herein. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A magnetic memory device comprising:
    a reference layer comprising,
        a first junction magnetic layer including CoFeB;
        a first vertical magnetic layer including CoPt or CoPd; and
        a first non-magnetic layer between the first vertical magnetic layer and the first junction magnetic layer, wherein the first junction magnetic layer is antiferromagnetically or ferromagnetically exchange coupled with the first vertical magnetic layer by the first non-magnetic layer, and wherein CoFeB of the first junction magnetic layer is in direct contact with the first non-magnetic layer;
    a free layer comprising a second junction magnetic layer; and
    a tunnel barrier layer between the free layer and the reference layer.

2. The magnetic memory device of claim 1, wherein the second junction magnetic layer comprises CoFeB.

3. The magnetic memory device of claim 1, wherein the first vertical magnetic layer comprises at least one of Cr, Pt, Pd, and Ir.

4. The magnetic memory device of claim 1, wherein the first vertical magnetic layer comprises a multi layer of [Co/Pd]m or [Co/Pt]m, wherein the m is a stacking number of each layer and a natural number of 2 or more.

5. The magnetic memory device of claim 1, wherein the first junction magnetic layer is in direct contact with the tunnel barrier layer.

6. The magnetic memory device of claim 1, wherein the second junction magnetic layer is in direct contact with the tunnel barrier layer.

7. The magnetic memory device of claim 1, wherein the free layer further comprises a second vertical magnetic layer and a second non-magnetic layer, and
    wherein the second non-magnetic layer is disposed between the second junction magnetic layer and the second vertical magnetic layer.

8. The magnetic memory device of claim 7, wherein the second junction magnetic layer is antiferromagnetically or ferromagnetically exchange coupled with the second vertical magnetic layer by the second non-magnetic layer.

9. A magnetic memory device comprising:
    a magnetic layer having perpendicular magnetization;
    a first junction magnetic layer;
    an exchange-coupling layer disposed between the magnetic layer and the first junction magnetic layer;
    a second junction magnetic layer; and
    a tunnel barrier layer between the first junction magnetic layer and the second junction magnetic layer, wherein a crystal structure of the first junction magnetic layer is different than a crystal structure of the magnetic layer having perpendicular magnetization.

10. The magnetic memory device of to claim 9, wherein the first and second junction magnetic layers comprise CoFeB.

11. The magnetic memory device of claim 9, wherein the first junction magnetic layer is antiferromagnetically or ferromagnetically exchange coupled with the magnetic layer by the exchange-coupling layer.

12. The magnetic memory device of claim 9, wherein the first junction magnetic layer has a first saturation magnetization and the second junction magnetic layer has a second saturation magnetization, and wherein the first and second saturation magnetizations are different.

13. The magnetic memory device of claim 12, wherein the first saturation magnetization is higher than the second saturation magnetization.

14. The magnetic memory device of claim 9, wherein the exchange-coupling layer is a non-magnetic layer.

15. The magnetic memory device of claim 9, wherein the first and second junction magnetic layers are in direct contact with the tunnel barrier layer.

16. A magnetic memory device comprising:
a reference layer comprising,
a first junction magnetic layer including CoFeB and having a first saturation magnetization,
a first vertical magnetic layer including CoPt or CoPd and having perpendicular magnetization, and
a first non-magnetic layer between the first vertical magnetic layer and the first junction magnetic layer, wherein the first junction magnetic layer is antiferromagnetically or ferromagnetically exchange coupled with the first vertical magnetic layer by the first non-magnetic layer;
a free layer comprising a second junction magnetic layer having a second saturation magnetization wherein the second saturation magnetization is less than the first saturation magnetization; and
a tunnel barrier layer between the free layer and the reference layer.

17. The magnetic memory device of claim 9 wherein the magnetic layer comprises $Co_3Pt$.

18. The magnetic memory device of claim 1 wherein a crystal structure of the first junction magnetic layer is different than a crystal structure of the first vertical magnetic layer.

19. The magnetic memory device of claim 9, wherein the magnetic layer comprises a multi layer of [Co/Pd]m or [Co/Pt]m, wherein the m is a stacking number of each layer and a natural number of 2 or more.

20. The magnetic memory device of claim 17 wherein a crystal structure of the first junction magnetic layer is different than a crystal structure of the first vertical magnetic layer.

21. A magnetic memory device comprising:
a first vertical magnetic layer including Pt or Pd;
a non-magnetic layer on the first vertical magnetic layer;
a first junction magnetic layer including Fe or B on the non-magnetic layer wherein the non-magnetic layer is between the first vertical magnetic layer and the first junction magnetic layer;
a tunnel barrier on the first junction magnetic layer wherein the first junction magnetic layer is between the non-magnetic layer and the tunnel barrier;
a second junction magnetic layer including Fe or B on the tunnel barrier wherein the tunnel barrier is between the first and second junction magnetic layers; and
wherein the first junction magnetic layer directly contacts with the tunnel barrier, and the first junction magnetic layer is exchange coupled with the first vertical magnetic layer by the non-magnetic layer; and
wherein a crystal structure of the first junction magnetic layer is different than a crystal structure of the first vertical magnetic layer.

* * * * *